(12) United States Patent
Murahara et al.

(10) Patent No.: US 6,689,426 B1
(45) Date of Patent: Feb. 10, 2004

(54) SOLID SURFACE MODIFICATION METHOD AND APPARATUS

(75) Inventors: Masataka Murahara, Kamakura (JP); Masakatsu Urairi, Ibaraki (JP)

(73) Assignees: Tokai University, Tokyo (JP); Nitto Denko Corp., Osaka (JP)

(*) Notice: Subject to any disclaimer, the term of this patent is extended or adjusted under 35 U.S.C. 154(b) by 0 days.

(21) Appl. No.: 09/639,006

(22) Filed: Aug. 15, 2000

Related U.S. Application Data (62) Division of application No. 08/888,862, filed on Jul. 7, 1997, now Pat. No. 6,117,497, which is a continuation of application No. 08/343,575, filed as application No. PCT/JP94/00463 on Mar. 23, 1994, now abandoned.

(30) Foreign Application Priority Data

| Mar. 23, 1993 | (JP) | 5-064096 |
| Apr. 2, 1993 | (JP) | 5-076888 |
| Apr. 7, 1993 | (JP) | 5-080435 |
| Apr. 9, 1993 | (JP) | 5-083555 |
| Sep. 24, 1993 | (JP) | 5-238349 |
| Sep. 24, 1993 | (JP) | 5-238350 |
| Sep. 24, 1993 | (JP) | 5-238351 |

(51) Int. Cl.[7] ............... C23C 18/14; C23C 18/16; C08J 7/04; C08J 7/06; C08J 7/18; B05D 5/10; B05D 5/06; B05D 5/00

(52) U.S. Cl. ............... 427/581; 427/512; 427/516; 427/164

(58) Field of Search ............... 427/512, 516, 427/581, 508, 510, 493, 492, 553, 534, 555, 558, 169, 164, 162

(56) References Cited

U.S. PATENT DOCUMENTS

| 4,251,215 A | * | 2/1981 | May et al. .......... 264/17 |
| 4,289,381 A | * | 9/1981 | Garvin et al. ......... 427/555 |
| 4,289,821 A | * | 9/1981 | Gray, III et al. ...... 427/516 |
| 4,355,053 A | * | 10/1982 | Nezu et al. .......... 427/516 |
| 4,405,854 A | * | 9/1983 | Lapointe ............. 264/17 |

(List continued on next page.)

FOREIGN PATENT DOCUMENTS

| EP | 0 285 273 | 10/1988 |
| EP | 0285273 | * 10/1988 |

(List continued on next page.)

OTHER PUBLICATIONS

S. P. Pappas, Ph.D., ed. *UV Curing; Science & Technology*, "Light Sources" by V.D. McGinniss, p. 96–129, (1978, no month) Tech. marketing, Corp., Conn. USA.*

(List continued on next page.)

*Primary Examiner*—Marianne Padgett
(74) *Attorney, Agent, or Firm*—Pennie & Edmonds LLP (57) ABSTRACT

A liquid compound or a compound solution is kept in contact with the surface of a solid material (synthetic resin, glass, metal, or ceramic), radiation selected from ultraviolet, visible, and infrared is irradiated on the interface between the surface of the solid material and the compound to optically excite the surface of the solid material and the compound, thereby effecting substitution with a chemical species in the compound, depositing or performing etching with the chemical species. Preferably, a transparent window is kept in tight contact with the surface of a solid material to be treated, a thin layer of the liquid compound or the compound solution is interposed between the surface of the solid material and the transparent window by using capillarity, and ultraviolet, visible, or infrared is irradiated through the window. With this treatment, the irradiated portion can be given hydrophilicity, adhesion properties, printing properties, corrosion resistance, and conductivity.

8 Claims, 5 Drawing Sheets

U.S. PATENT DOCUMENTS

| | | | | | |
|---|---|---|---|---|---|
| 4,415,615 | A | * | 11/1983 | Esmay et al. | 427/516 |
| 4,511,595 | A | * | 4/1985 | Inoue | 427/581 |
| 4,544,572 | A | * | 10/1985 | Sandvig et al. | 427/493 |
| 4,544,573 | A | * | 10/1985 | Dohashi et al. | 427/516 |
| 4,647,474 | A | * | 3/1987 | Masuda et al. | 427/512 |
| 4,654,006 | A | * | 3/1987 | Kusano et al. | 264/17 |
| 4,743,463 | A | * | 5/1988 | Ronn et al. | 427/597 |
| 4,746,469 | A | * | 5/1988 | Yamashita | 264/17 |
| 4,544,572 | A | | 6/1988 | Sandvig et al. | |
| 4,766,009 | A | * | 8/1988 | Imura et al. | 427/581 |
| 4,778,724 | A | * | 10/1988 | Bragole | 427/516 |
| 4,801,477 | A | * | 1/1989 | Fudim | 427/512 |
| 5,135,685 | A | * | 8/1992 | Masuhara et al. | 264/17 |
| 5,135,686 | A | * | 8/1992 | Masuhara et al. | 264/17 |
| 5,318,807 | A | * | 6/1994 | Gili Picoy | 427/510 |
| 5,419,968 | A | * | 5/1995 | Okada et al. | 427/581 |
| 5,470,617 | A | * | 11/1995 | Nishii et al. | 427/581 |
| 5,582,955 | A | * | 12/1996 | Keana et al. | 427/581 |
| 5,614,269 | A | * | 3/1997 | Hoskins et al. | 427/581 |
| 5,635,257 | A | * | 6/1997 | Nishii et al. | 427/581 |
| 5,859,086 | A | * | 1/1999 | Freund et al. | 427/581 |
| 6,007,876 | A | * | 12/1999 | Nilno | 427/581 |
| 6,451,386 | B1 | * | 9/2002 | Simonetti | 427/512 |
| 2002/0187279 | A1 | * | 12/2002 | Kiode | 427/558 |

FOREIGN PATENT DOCUMENTS

| | | |
|---|---|---|
| EP | 0 285 446 | 10/1988 |
| EP | 0 346 485 | 12/1989 |
| FR | 2091023 | 1/1972 |
| GB | 988759 | 4/1965 |
| JP | 64-9243 | 1/1989 |
| JP | 5-5192 | 1/1993 |
| WO | WO 91/14730 | 10/1991 |

OTHER PUBLICATIONS

*Hackh's Chemical Dictionary*, $3^{rd}$ ed., J. Grant. ed, McGraw–Hill Book Co., Inc., N.Y. (1944, no month), examples p. 377–378, 635–636,241.*

G.G. Hawley ed, *The Condensed Chemical Dictionary*, $10^{th}$ed., Van Nastrand Reinhold Co. (1981, no month), examples, p. 470–471, 498–499.*

S. P. Pappas, Ph. D., ed . *U.V. Curing: Science Technology*, "Light Sources" by V.D. McGinniss, pp. 96–129 (1978) Tech. no month.

Hackh's Chemical Dictionary, 3. sup.rd ed., J. Grant. Ed. McGraw–Hill Book Co., Inc., N.Y. (1944) examples p. 377–378.

G.G. Hawley ed., The Condensed Chemical Dictionary, 10. Sup th ed., Van Nostrand Reinhold Fo. (1981), examples, p. 470–471, 498–499.

Copy of European Supplementary Search Report for European application 94910522.5, dated Nov. 5, 1997.

* cited by examiner

SOLID SURFACE MODIFICATION METHOD AND APPARATUS

This is a division of application Ser. No. 08/888,862, filed Jul. 7, 1997 now U.S Pat. No. 6,117,497. The application Ser. No. 08/888,862 is a Continuation application under 37 CFR §1.62 of prior patent application Ser. No. 08/343,575 filed on Feb. 17, 1995 now abandoned, which is a 371 of PCT/US94/00463 filed Mar. 23, 1994.

TECHNICAL FIELD

The present invention relates to a method of photochemically modifying the surface of a solid workpiece to be surface-treated, e.g., formed of a synthetic resin, glass, a metal, an animal or a plant, or a ceramic, by bringing a liquid compound in or a compound solution into contact with the surface of the solid workpiece, preferably by using a capillary phenomenon, and irradiating the sample with light in this state. The present invention also relates to an adhesion method and a marking method using this surface modification method, and an apparatus for carrying out these methods.

BACKGROUND ART

There are known a method in which for the purpose of modifying the surface of a fluoroplastic, which is difficult to adhere because of its small affinity for other substances, a fluoroplastic is immersed in a treatment solution comprising liquid ammonia or naphthalene containing metal sodium and tetrahydrofuran to modify the surface, as well as a method of chemically modifying the surface of a polyethylene or polypropylene resin, which is chemically inactive and therefore difficult to directly print or adhere, by dipping into a mixed solution of potassium dichromate with concentrated sulfuric acid.

Unfortunately, these conventional chemical modification methods have problems in that, in the case of a fluoroplastic, for example, the surface of a fluoroplastic material turns brown to make the surface layer brittle, resulting in peeling of the adhesive layer. Consequently, no satisfactory adhesive strength can be obtained. In addition, although the above conventional methods can modify an entire portion which is immersed, they cannot perform partial modification unless a photoresist is used as a mask. Also, the treatment reaction is difficult to control, and dangerous chemicals must be used.

There are some other known methods, such as sputtering, corona discharge, and plasma processing, by which the surface of a fluoroplastic or the like is physically modified. However, because of the lack of chemical affinity for an adhesive, a roughened surface formed acts as a stress concentration point, bringing about bonding breakdown. This makes it impossible to obtain a high bonding strength.

A polymeric porous membrane or film made from a fluoroplastic, such as polytetrafluoroethylene (PTFE) or polyvinylidene fluoride, or from a polyethylene or polypropylene resin is being used as a filtering membrane in precision filtration and ultrafiltration of liquids such as chemicals, foods, and water. Several methods are known as a means for imparting hydrophilicity to these porous membranes in order to improve the rate of permeation of liquids. Examples are a method of coating a surface active agent, and a method as described in Jpn. Pat. Appln. KOKAI Publication No. 56-63772, in which pores of a porous body are impregnated with a water-soluble polymer, such as polyvinyl alcohol or polyethylene glycol, and hydrophilicity is imparted to the porous body by, e.g., a heat treatment, acetal conversion, esterification, a dichromic acid treatment, or irradiation of ionizing radiation. There is another known method by which the surface of a fluoroplastic is modified by giving hydrophilicity to the surface by irradiation of an ArF laser, as disclosed in Jpn. Pat. Appln. KOKOKU Publication No. 5-77692.

In the method of coating a surfactant, however, the surfactant is readily removed since it does not strongly adhere to a porous body, resulting in difficult in keeping hydrophilicity.

In the method described in Jpn. Pat. Appln. KOKAI Publication No. 56-63772, deterioration by decomposition of a porous body is brought about if, for example, irradiation is used, and this significantly decreases the mechanical strength. In addition, the use of a heat treatment, acetal conversion, or esterification poses a problem of a low degree of hydrophilicity, since a portion of the water-soluble polymer is given hydrophobicity.

Also, the method described in Jpn. Pat. Appln. KOKOKU Publication No. 5-77692 is a method of modification of a surface layer; i.e., it is not possible to sufficiently impart hydrophilicity to the bulk of a porous body.

The present invention has been made in consideration of the above situations and has as its object to provide a method in which a liquid which is safe at room temperature is brought into contact with the surface of a workpiece (a material to be modified), and in this state light such as ultraviolet light is irradiated on the surface of the workpiece to selectively and effectively substitute the surface with an arbitrary functional group with no damage to the surface at all, thereby modifying the surface of the workpiece. The present invention also provides a treatment apparatus for this method.

Preferably, it is an object of the present invention to provide a method in which the liquid described above is forced to closely contact, as an extremely thin layer, with the surface of a workpiece by using a capillary phenomenon or the like, and in this state light such as ultraviolet light is irradiated on the surface of the workpiece to selectively and effectively substitute the surface with an arbitrary functional group with no damage to the surface at all, thereby modifying the surface of the workpiece, and to provide a treatment apparatus for this method.

The use of a liquid as a surface modifier allows a high-density, uniform treatment, since the density of contact with an object to be treated is high compared to a gas. The use of a liquid is also advantageous from the standpoint of environment because only an exposed portion is activated by light such as ultraviolet radiation.

Incidentally, when laser light is incident on a solution of the type discussed above, bubbles are usually generated by photo-decomposition, and consequently a treatment solution on the interface of an object to be treated is removed from the interface. Then, an effective chemical reaction may not take place. Additionally, if the contact angle, with a reaction solution of the surface of an object to be treated is large, the area of contact with the liquid surface becomes small. This contact area is further decreased by generation of bubbles described above.

In the present invention, therefore, the space between the surface of glass as an entrance window for light such as ultraviolet radiation and the surface of a workpiece is made very thin. Consequently, a reaction solution enters this portion to permit formation of a thin liquid film on the surface of a workpiece regardless of the contact angle of the material with the solution. When light such as ultraviolet radiation is irradiated on the surface of the workpiece in this state, not only the liquid but the surface of the workpiece can be sufficiently excited because of a short path in the liquid. This makes effective optical modification feasible.

As discussed above, the surface layer of a solid workpiece can be photochemically, modified effectively by interposing a thin film of a reaction solution between the surface of the solid workpiece and transparent glass by using capillarity, and irradiating light on the surface of the workpiece in this state.

DISCLOSURE OF INVENTION

That is, the present invention provides a solid surface modification method, wherein a liquid compound or a compound solution is kept in contact with the surface of a solid material to be treated, radiation selected from the group consisting of ultraviolet radiation, visible radiation, and infrared radiation is irradiated on the interface between the surface of the solid material and the liquid compound or compounds in solution to optically excite the surface of the solid material and the liquid compound or compound solution, thereby effecting substitution with a chemical species in the liquid compound or compound in solution, depositing the chemical species, or performing etching with the chemical species.

According to one preferable aspect of the present invention, a thin layer of the liquid compound or compound in solution is brought into contact with the surface of a solid material to be treated, and in this state ultraviolet radiation, visible radiation, or infrared radiation is irradiated on the interface between the surface of the solid material and the liquid compound or compound in solution. As a preferable means of forming this thin layer of the liquid compound or of the compound in solution, a transparent window is kept in close proximity with the upper surface of a solid material to be treated, and the thin layer is made to be interposed between them by using capillarity. In this state, radiation selected from ultraviolet radiation, visible radiation, and infrared radiation is irradiated through the transparent window to excite the surface of the solid material, thereby effecting substitution with a chemical species in the liquid compound or compound in solution, performing etching with the chemical species, or depositing the chemical species.

As the transparent window, it is possible to use any of ultraviolet-transmitting glass, rock crystal, synthetic quartz glass, pyrex glass, optical glass, plate glass, sapphire, diamond, $TiO_2$, IRTRAN, Ge, Si, barium fluoride, magnesium fluoride, calcium carbonate, lithium fluoride, calcium fluoride, a fluoroplastic, an acrylic resin, a styrene resin, and a carbonate resin.

The shape of the transparent window can be any of a plate, a cylinder, a sphere, a donut, and a mold. The solid material to be treated can be any of a plastic, a metal, an animal a plant, and a ceramic.

As the liquid compound, it is possible to use any of water, pure water, heavy water, an alcohol, petroleums, an aromatic compound, silicone oil, FOMBLIN oil, trichloroethylene, fluorocarbons (fluorocarbon (freon) 113 and fluorocarbon (freon) 113a), hydrogen peroxide, HCl, $H_2SO_4$, $HNO_3$, HCOOH, $(COOH)_2$, $CH_3COOH$, $NH_3$, $N_2H_4$, and $NH_4F$.

A solvent can be selected from water, pure water, heavy water, ammonia, sulfuric acid, carbon tetrachloride, carbon disulfide, hydrocarbons, halogen compounds, alcohols, phenols, an organic acid and a derivative thereof, nitrites, nitro compounds, amines, sulfur compounds, petroleums, and ethers.

Radiation usable in the present invention can be selected from an excimer laser, an $Ar^+$ laser, $Kr^+$ laser, an $N_2$ laser, a harmonics ultraviolet laser obtained by a nonlinear material, a $D_2$ lamp, a high-pressure mercury lamp, a low-pressure mercury lamp, an Xe lamp, an Hg—Xe lamp, a halogen lamp, an excimer lamp, and an ultraviolet lamp obtained by an arc, corona, or silent discharge in an atmosphere of air, nitrogen, or some other gas.

If the solid material to be treated is a fluoroplastic material, a solution having an atom, such as B, Al, Ba, Ga, Li, H, or Ti, whose bonding energy to a fluorine atom is larger than 128 kcal/mol, which is the bonding energy between a carbon atom and a fluorine atom, and a functional group with affinity for an adhesive, such as one selected from —OH, —Cl, —$NO_2$, —CN, —$NH_2$, —COOH, —CO, —$OCH_3$, —$OC_2H_5$, —$OC_3H_7$, —$OC_4H_9$, —CONH, —$CH_3$, —$C_2H_5$, —$CH_2$, —$SO_3H$, —$C_3H_7$, —$C_4H_9$, and —$C_6H_5$, is brought into contact with the surface of the fluoroplastic material, and in this state ultraviolet radiation in an amount sufficient to liberate fluorine from the fluoroplastic material, i.e., at at least a photoenergy corresponding to the bonding energy of 128 kcal/mol is irradiated on the interface between the fluoroplastic material and the solution. Consequently, it is possible to liberate fluorine from the fluoroplastic material and at the same time substitute the fluorine with this functional group, thereby performing surface modification. This surface-modified fluoroplastic material can be easily bonded to a material of the same kind or a different kind via the adhesive.

That is, the present invention provides a method of bonding a fluoroplastic material, wherein prior to bonding a fluoroplastic material to a material of the same type or a different type via adhesion, the fluoroplastic material is brought into contact with a solution containing a compound having an atom with a bonding energy to a fluorine atom of 128 kcal/mol or more and one of a hydrophilic group, a lipophilic group, and a functional group inherent in an adhesive, and in this state ultraviolet radiation with a photon energy of 128 kcal or more is irradiated on the interface between the fluoroplastic material and the solution, thereby performing surface modification in which the fluoroplastic material is defluorinated and substitution is done by the functional group having affinity for the adhesive.

In addition, the present invention provides a method of manufacturing a fluoroplastic composite material, wherein fluoroplastic materials subjected to surface modification by the method described above, or such a surface-modified fluoroplastic material and a resin material of a different kind, are bonded by pressure with an organic solvent in which the materials are soluble.

Furthermore, the present invention provides a method of marking a fluoroplastic material, wherein an ink or paint containing a compound having an atom with a bonding energy to a fluorine atom of 128 kcal/mol or more and one of a hydrophilic group, a lipophilic group, and a functional group inherent in an adhesive is coated on a fluoroplastic material, and ultraviolet radiation with a photon energy of 128 kcal or more is irradiated on the interface between them.

In the present invention, fluoroplastics include a resin made from a polymer or a copolymer of monomers, which contains fluorine atoms, and a resin containing this resin as a base material. Examples are polytetrafluoroethylene, polychlorotrifluoroethylene, tetrafluoroethylene-hexafluoropropylene, and polyvinylidenefluoride.

Examples of the compound having an atom with a bonding energy to a fluorine atom of 128 kcal/mol or more are a boron compound, an aluminum compound, a barium compound, a gallium compound, a lithium compound, a hydrogen compound, and a titanium compound. Practical examples of the compound are $(BHNH)_3$, $LiBH_4$, $NaBH_4$, $KBH_4$, $CsBH_4$, $H_3BO_3$, $B(CH_3)_3$, $B(C_2H_5)_3$, $B(C_3H_7)_3$, $B(C_4H_9)_3$, $B(C_6H_5)_3$, $B(OH)_2(C_6H_5)$, $NaB(C_6H_5)_4$, $B(CH_3O)_3$, $B(C_2H_5O)_3$, $B(C_4H_9O)_3$, $(NH_4)_2B_4O_7$, $Al(OH)_3$, $Al(NO_3)_3$, $AlCl_3$, $AlBr_3$, $AlI_3$, $Al_2(SO_4)_3$, $Al(CH_3COO)_2OH$, $Al_2BaO_4$, $NH_4AlCl_4$, $LiAlH_4$, $ALNa(SO_4)_2$, $AlK(SO_4)_2$, $Al(NH_4)SO_4$, $Al(CH_3)_3$, $Al(C_3H_7)_3$, $Al(C_2H_5)_3$, $Al(C_6H_5)_3$, $Al(C_2H_7O)_3$, $Al(C_3H_7O)_3$, $Al(C_4H_9O)_3$, $Ba(ClO_4)_2$, $BaBr$, $BaI_2$, $Ba(OH)_2$, $BaS_2O_3$, $Ba(NO_2)_2$, $Ba(CN)_2$, $GaCl_3$, $GaBr$, $Ga(OH)_3$, $Ga(SO_4)_3$, $Ga(NO_3)_3$, $Ga(CH_3COO)_3$, $GaK(SO_4)_2$, $Ga(CH_3)_3$, $Ga(C_2H_5)_3$, $Ga(C_3H_7)_3$, $Ga(C_4H_9)_3$, $Ga(C_6H_5)_3$, $LiCl$, $LiBr$, $LiI$, $LiOH$, $LiSH$, $LiN$, $LiNO_3$, $Li(CH_3)$, Li(hydrocarbon compound), $Li(C_6H_5)$, $LiCH_3O$, $LiAlH[OC(CH_3)_3]_3$, $LiNH_2$, $H_2O$, $D_2O$, $H_2O_2$, $HCOOH$, $CH_3COOH$, $HCl$, $HNO_3$, $H_2SO_4$, $C_6H_6$, $C_6H_5CH_3$, $Ti(CH_2C_6H_5)_4$, $[Ti(C_6H_5)_2]_2$, $TiCl_3$, $TiBr4$, and $TiI4$.

Examples of the functional group with affinity for an adhesive are —OH, —Cl, —NO$_2$, —CN, —NH$_2$, —COOH, —CO, —OCH$_3$, —OC$_2$H$_5$, —OC$_3$H$_7$, —OC$_4$H$_9$, —CONH, —CH$_3$, —C$_2$H$_5$, —CH$_2$, —SO$_3$H, —C$_3$H$_7$, —C$_4$H$_9$, and —C$_6$H$_5$.

If a boron compound, an aluminum compound, a barium compound, a gallium compound, or a lithium compound is a liquid at room temperature, it is only necessary to irradiate ultraviolet radiation with a photon energy of 128 kcal or more onto the interface with a workpiece in the liquid. If the compound is in a solid or powder form, the compound is dissolved in a solvent such as water, heavy water, ammonia, sulfuric acid, carbon tetrachloride, carbon disulfide, hydrocarbons, halogen compounds, alcohols, phenols, an organic acid or its derivative thereof, nitrites, nitro compounds, amines, or sulfur compounds, and ultraviolet radiation with a photon energy of 128 kcal or more is irradiated onto the interface with a workpiece in the resultant solution.

Examples of ultraviolet radiation with a photon energy of 128 kcal or more are an ArF excimer laser, an Hg lamp, and an Hg—Xe lamp. An ArF excimer laser can be shaped into a linear beam by a cylindrical lens and irradiated along the interface between a fluoroplastic material being continuously pulled up from the solution and the solution. It is also possible to irradiate an ArF excimer laser via a pattern corresponding to a bonding portion of a fluoroplastic material. Ultraviolet radiation can also be one from an ultraviolet lamp obtained by an arc, corona, or silent discharge in an atmosphere of air, nitrogen, or some other gas.

A solution containing a compound having an atom with a bonding energy to a fluorine atom of 128 kcal/mol or more and one of a hydrophilic group, a lipophilic group, and a functional group inherent in the adhesive can be mixed in the adhesive in advance. In addition, it is also possible to coat the resultant mixture on the surface of the fluoroplastic material, and to irradiate ultraviolet radiation with a photon energy of 128 kcal or more on the interface of the coating layer to form an adhesive layer on the surface of the fluoroplastic material. Furthermore, a porous material can be impregnated with a solution containing a compound having an atom with a bonding energy to a fluorine atom of 128 kcal/mol or more and one of a hydrophilic group, a lipophilic group, and a functional group inherent in the adhesive. In this case, the resultant porous material is kept in tight contact with the fluoroplastic material, and in this state ultraviolet radiation with a photon energy of 128 kcal or more is irradiated on the interface between them.

According to the present invention as discussed above, fluorine is liberated or extracted from the surface of a fluoroplastic material, and this fluorine is replaced by a functional group with affinity for an adhesive. As a result, the affinity of the surface of the fluoroplastic material for the adhesive is improved to achieve a high adhesive strength.

If a solid material to be treated is a plastic material having a C—H bond, a liquid of a compound containing an atom, e.g., B, P, S, Pt, Br, O, Cl, H, or F, whose bonding energy to a hydrogen atom is larger than 80.6 kcal/mol, which is the bonding energy between a carbon atom and a hydrogen atom, a functional group (atomic group), such as —OH, —NO$_2$, —CN, —NH$_2$, —COOH, —CO, —OCH$_3$, —OC$_2$H$_5$, —OC$_3$H$_7$, —OC$_4$H$_9$, —CONH, —CH$_3$, —C$_2$H$_5$, —CH$_2$, —SO$_3$H, —C$_3$H$_7$, —C$_4$H$_9$, or —C$_6$H$_5$, or a metal atom, is brought into contact with the surface of the plastic material having a C—H bond or with a porous body. Surface modification can be performed in this state by irradiating ultraviolet radiation with a photon energy of 80.6 kcal or more onto the interface between the surface of the plastic material and the compound having both the atom and the atomic group or metal atom described above, or a mixture of the compound.

That is, the present invention provides a method of modifying a plastic material having a C—H bond with excitation light, wherein a liquid of a compound or of a mixture, which contains a first atom with a bonding energy to a hydrogen atom of 80.6 kcal/mol or more and a second atom or atomic group whose bonding energy to the first atom is smaller than an optical energy of excitation light, is brought into contact with the plastic material, and in this state ultraviolet radiation with a photon energy of 80.6 kcal or more is directly or indirectly irradiated on the interface between the plastic material and the compound or mixture, thereby liberating or extracting hydrogen from the plastic material via the first atom and at the same time substituting the hydrogen with the second atom or atomic group.

The compound containing the second atom or atomic group whose bonding energy to the first atom is smaller than the optical energy of the excitation light is a liquid containing a compound selected from a boron compound, a phosphorus compound, a sulfur compound, a platinum compound, a bromine compound, an oxygen compound, a chlorine compound, a hydrogen compound, and a fluorine compound.

Practical examples of the compound are $(BHNH)_3$, $B(CH_3)_3$, $B(C_2H_5)_3$, $B(C_6H_5)_3$, $B(OH)_2(C_6H_5)$, $P(CN)_3$, $P_2Se_5$, $P(CH_3)_3$, $P(C_2H_5)_3$, $P(C_3H_7)_3$, $P(C_4H_9)_3$, $P(C_6H_{13})_3$, $P(CH_3)_2(C_6H_5)$, $P(CH_3)(C_6H_5)_2$, $P(C_6H17)_3$, $P(C_6H_{13})_3$, $P(C_8H_{17})_3$, $P(CH_3C_6H_4)_3$, $(SCN)_2$, $SO_2(NH_2)_2$, $Pt(CN)_2$, $Pt(SO_4)_2$, $BrCN$, $Br_2O$, $Br_2CF_2$, $BrCF_3$, $NO$, $NO_2$, $H_2O_2$, $O_3$, $Cl_2O$, $ClCN$, $AgCl$, $AlCl_3$, $AsCl_3$, $AuCl$, $AuCl_3$, $BaCl_2$, $BeCl_2$, $BiCl_3$, $CaCl_2$, $CdCl_2$, $CeCl_3$, $CoCl_2$, $CrCl_2$, $CsCl$, $CuCl$, $CuCl_2$, $ErCl_3$, $EuCl_2$, $EuCl_3$, $FeCl_n$, $GaCl_3$, $GdCl_3$, $GeCl_4$, $H_3BO_3$, $Na_2[Pt(OH)_6]$, $K_2[Pr(OH)_6]$, $O_2$, $CClF_3$, $CCl_2F_2$, pure water, heavy water, $(COOH)_2$, $CF_4$, $CHF_3$, $HgCl_2$, $HoCl_3$, $InCl$, $IrCl_4$, $KCl$, $LiCl$, $LuCl_3$, $MgCl_2$, $MnCl_2$, $MoCl_n$, $NCl_3$, $NH_4Cl$, $NaCl$, $NbCl5$, $NiCl_2$, $PCl_3$, $PbCl_2$, $PtCl_n$, $RbCl$, $ReCl_3$, $SCl_n$, $SbCl_3$, $SeCl_n$, $SiCl_4$, $SnCl_n$, $SrCl_2$, $TaCl_2$, $TbCl_3$, $TeCl_n$, $ThCl_4$, $TiCl_3$, $TlCl_3$, $TmCl_3$, $UCl_n$, $VCl_n$, $WCl_6$, $YCl_3$, $ZnCl_2$, $ZrCl_4$, $H_2O$, $NH_3$, $HCOOH$, $NH_3OH$, $H_2SO_4$, $HCl$, $HNO_3$, $HCF_3$, alcohols, hydrocarbons, aromatics, $AgF$, $ASF_3$, $BaF_2$, $BeF_2$, $BiF_3$, $CdF_2$, $CeF_3$, $CoF_2$, $CsF$, $CuF$, $GeF_2$, $KF$, $MoFn$, $NH_4F$, $NaF$, $NbF_5$, $NiF$, $UF_6$, $VF_n$, $ZnF_2$, and $CF_4$.

Examples of the atomic group are —OH, —NO$_2$, —CN, —NH$_2$, —COOH, —CO, —OCH$_3$, —OC$_2$H$_5$, —OC$_3$H$_7$, —$OC_4H_9$, —$CONH$, —$CH_3$, —$C_2H_5$, —$CH_2$, —$SO_3H$, —$C_3H_7$, —$C_4H_9$, and —$C_6H_5$.

The above compound can be dissolved in a solvent such as water, pure water, heavy water, ammonia, sulfuric acid, carbon tetrachloride, carbon disulfide, hydrocarbons, halogen compounds, alcohols, phenols, organic acids and derivatives thereof, nitriles, nitro compounds, amines, or sulfur compounds.

The ultraviolet radiation with a photon energy of 80.6 kcal or more is one or a combination of excimer lasers, such as XeF, XeCl, KrF, and ArF lasers, an $N_2$ laser, a Kr ion laser, an Ar ion laser, and harmonics laser light by a nonlinear element, one or a combination of an Hg lamp, an He—Xe lamp, a $D_2$ lamp, and an excimer lamp, or one or a combination of ultraviolet radiations obtained by an arc, corona, or silent discharge in an atmosphere of air, nitrogen, or some other gas.

If the bonding energy of a side chain, except for a C—H bond, which constitutes a plastic material, is smaller than a photon energy of excitation light for optically decomposing the compound, ultraviolet radiation whose photon energy is 80.6 kcal or more and smaller than the bonding energy of a side chain except for the C—H bond can be directly irradiated on the plastic material, and another ultraviolet radiation with a photon energy larger than the bonding energy of the compound can be irradiated on the compound so as not to directly illuminate the plastic material (it can, for example, be irradiated parallel to the surface of the plastic material).

In this case, it is possible to use an XeF, XeCl, or KrF laser as ultraviolet radiation to be directly irradiated on the plastic material having the C—H bond, and an XeCl, KrF, or ArF laser as ultraviolet radiation to be indirectly incident parallel to the surface of the plastic material.

In addition, an Hg or Hg—Xe lamp light with a wavelength of 300 nm or more can be used as ultraviolet radiation to be directly irradiated on the plastic material having the C—H bond, and an Hg, Hg—Xe, $D_2$, or excimer lamp with a wavelength of 300 nm or more can be used as ultraviolet radiation to be indirectly incident parallel to the surface of the plastic material.

As described above, hydrogen atoms on the surface of a plastic material must be liberated from the surface of the plastic material before being substituted with the atomic group or the metal atom. Since the energy of this C—H bond is 80.6 kcal/mol, it is necessary to break the bond by irradiating an optical energy larger than this energy. To prevent recombination of H and C atoms, however, an atom with a bonding energy larger than that of the C atom must be present near the H atom.

Comparison of bonding energies is presented below. In this comparison, each number is expressed in kcal/mol.

| C—H < | B—H < | P—H < | S—H < | Pt—H < | Br—H < |
|---|---|---|---|---|---|
| 80.6 | 80.7 | 82 | 82.3 | 84 | 87.4 |
| O—H < | Cl—H < | H—H < | F—H | | |
| 102.3 | 103.3 | 104.2 | 135.9 | | |

The larger the bonding energy, the larger the power of dehydrogenation. Examples of a compound of an atom capable of dehydrogenation are shown in claim 2. Although dehydrogenation is possible by B, P, S, Pt, or Br whose bonding energy is relatively low, O, Cl, H, and F are practical. Of these atoms, H and F atoms have the strongest dehydrogenation power. To be precise, it is desirable that the photon energy to be irradiated be smaller than the bonding energy of a molecule bonded to hydrogen.

A liquid of a compound or of a mixture, which contains the atom and the atomic group (functional group) for dehydrogenation, or a compound dissolved in a solvent, is brought into contact with a plastic material having a C—H bond, and ultraviolet radiation with energy required to break the C—H bond and the bond of dehydrogenation atom of the compound is irradiated on the interface between them. Consequently, dehydrogenation and substitution reactions occur simultaneously, modifying the surface of the plastic material.

If the bonding energy for decomposing the compound is larger than the energy of the C—H bond, ultraviolet radiation with a high photon energy is irradiated parallel to the surface of a plastic material, and at the same time ultraviolet radiation with a lower photon energy (higher than 80.6 kcal) is irradiated perpendicularly to the plastic material, in order to decompose only the compound in the vicinity of the plastic material. This allows more effective modification.

In the present invention as discussed above, hydrogen is liberated from the surface of a plastic material having a C—H bond, and this hydrogen is substituted with various types of functional groups or metal atoms. As a result, the surface of the plastic material acquires wettability, printing properties, adhesion properties, corrosion resistance, conductivity, and conductor characteristics.

If a solid material to be treated is a porous film, e.g., a fluoroplastic porous film, pores of the fluoroplastic porous film are impregnated with a compound having an atom with a bonding energy to a fluorine atom of 128 kcal/mol or more and a hydrophilic group or a lipophilic group. In this state radiation with a photon energy of 128 kcal or more can be irradiated to modify the fluoroplastic porous film.

By irradiating radiation with a photon energy of 128 kcal or more in this fashion, the C—F bond (128 kcal/mol) of the fluoroplastic is broken. In this case, by allowing an atom with energy higher than the C—F bonding energy to exist, the fluorine atom thus broken is bonded to the atom and trapped. Since a fluorine atom has a large electronegativity of 4.0, recombination of C and F can be prevented by making an atom with an electronegativity smaller than that of a carbon atom (electronegativity: 2.5) exist. Also, the bond between this atom and a fluorine atom is difficult to break again, since the bonding energy of this bond is higher than that of the C—F bond (128 kcal/mol). Therefore, some fluorine atoms of the fluoroplastic can be substituted with a hydrophilic functional group.

The radiation in this case can be selected from the group consisting of an excimer laser, an $Ar^+$ laser, a $Kr^+$ laser, an $N_2$ laser, a harmonics ultraviolet laser obtained by a nonlinear material, a $D_2$ lamp, a high-pressure mercury lamp, a low-pressure mercury lamp, an Xe lamp, an Hg—Xe lamp, a halogen lamp, an excimer lamp, and an ultraviolet lamp obtained by an arc, corona, or silent discharge in an atmosphere of air, nitrogen, or some other gas.

The compound described above can be selected from the group consisting of a boron compound, an aluminum compound, a hydrogen compound, a barium compound, a gallium compound, a lithium compound, and a titanium compound.

The porous body for use in the present invention is not particularly limited. In the case of a fluoroplastic porous body, examples other than PTFE are a tetrafluoroethylene-hexafluoropropylene copolymer, an ethylene-tetrafluoroethylene copolymer, a tetrafluoroethyleneperfluoroalkylvinylether copolymer, a vinyl fluoride resin, a vinylidene fluoride resin, and an ethylene chloride trifluoride resin.

This porous body can take any given shape, such as a sheet or a tube, and can be either a calcined or non-calcined product. The porosity and nominal pore size of the porous body can be freely set in accordance with the intended use. However, it is usually preferable that the porosity be 20 to 80% and the nominal pore size be about 0.01 to 10 $\mu$m.

A compound to be used in this case as a modification medium can be any of those enumerated above. These compounds can be used in the form of an aqueous solution and can be added with an alkali salt, such as sodium hydroxide or potassium hydroxide, in order to increase the solubility of the solute.

As a method of impregnating a porous body with the compound, any given simple method such as impregnation or coating can be employed. A porous body can also be subjected to ultrasonic cleaning in advance by dipping in an organic solvent.

As an example, various methods can be used in impregnating pores of a fluoroplastic porous body with the aqueous compound solution. It is, however, preferable to employ the following methods when the hydrophobicity of this porous body is taken into account.

(1) A method of performing impregnation through:
  (a) the first step of dipping a fluoroplastic porous body into an organic solvent (e.g., methanol, ethanol, acetone, ether, or isopropylalcohol) having a high compatibility with water and a surface tension of 30 dyne/cm or less, thereby impregnating the porous body with the solvent;
  (b) the second step of dipping the resultant porous body in water to replace the solvent with water (impregnate pores with water); and
  (c) the third step of dipping the porous body in an aqueous compound solution to replace water with the aqueous solution (impregnate pores with the aqueous solution).

(2) A method in which a compound is mixed in a low-surface-tension organic solvent as described above to prepare a solvent with a surface tension of 30 dyne/cm or less, and the resultant solvent is coated or sprayed on a fluoroplastic porous body, or the fluoroplastic porous body is dipped in the solvent, thereby impregnating pores of the fluoroplastic porous body with the aqueous compound solution.

With this method, it is possible to easily obtain a hydrophilic fluoroplastic porous film having a high hydrophilicity and improved in durability, chemical resistance, solvent resistance, and heat resistance, without performing any vacuum operation such as a discharge process.

As an apparatus using capillarity mentioned above, the present invention provides a solid surface modification apparatus comprising a table for placing a solid material to be treated, a plate-like transparent window capable of being placed on the upper surface of the solid material placed on the table, illuminating means for irradiating ultraviolet radiation, visible radiation, or infrared radiation substantially perpendicularly on the upper surface of the solid material placed on the table, wherein a thin layer of a liquid compound or of a compound solution is interposed between the solid material and the plate-like transparent window by using capillarity, and in this state light is irradiated from the illuminating means onto the upper surface of the solid material to modify the solid surface.

This illuminating means can be so arranged as to selectively irradiate the upper surface of the solid material to be treated with ultraviolet radiation, visible radiation, or infrared radiation.

As an apparatus using a capillary phenomenon, the present invention also provides a solid surface modification apparatus comprising a rotatable rubber roller, a cylindrical transparent round rod or transparent pipe capable of rotating and placed parallel to the rubber roller, means for passing a sheet-like solid material to be treated between the rubber roller and the cylindrical transparent round rod or transparent pipe, illuminating means for linearly irradiating ultraviolet radiation, visible radiation, or infrared radiation to a position at which the rubber roller and the cylindrical transparent round rod or transparent pipe oppose each other, and means for urging the rubber roller and the cylindrical transparent round rod or transparent pipe against each other via the sheet-like solid material, wherein a thin layer of a liquid compound or of a compound solution is interposed between the sheet-like solid material and the cylindrical transparent round rod or transparent pipe by using capillarity, and in this state light is irradiated from the illuminating means onto the upper surface of the solid material to continuously modify the solid surface.

This illuminating means can be arranged outside the cylindrical transparent round rod or transparent pipe. Alternatively, the illuminating means can consist of a reflecting mirror arranged inside the transparent pipe and means for emitting a linear beam from an end portion of the pipe, or can be an elongated lamp inserted inside the transparent pipe. That is, the illuminating means can be properly chosen from these structures.

As an apparatus using capillarity, the present invention further provides a method of modifying the surface of a lens, wherein a lens to be subjected to a surface treatment is sandwiched between a concave lens and a convex lens, thin layers of a compound solution are interposed between the lens to be treated (e.g., a contact lens) and the concave lens and between the lens to be treated and the convex lens by capillarity, and in this state light is irradiated on both the surfaces of the lens to be treated to modify the surfaces.

In addition, the present invention provides a method in which a transparent liquid plastic (e.g., silicon rubber, fluoroplastic, or PMMA) is flowed on the surface of a solid material to be treated, which assumes a complicated shape, to form a mold, and the mold is hardened and released. Thereafter, a thin layer of a compound solution is interposed between this mold and the surface of the solid material to be treated (e.g., a denture) by using capillarity, and light is irradiated from the mold side onto the surface of the solid material, thereby modifying the surface.

Furthermore, the present invention provides an apparatus in which a window is formed into a donut-like shape, and a thin liquid film layer is interposed between the surface of a solid material to be treated (e.g., a sheath of an electric wire or a jacket of a tube), which corresponds to the inner circumferential surface of the donut-like window, and the inner circumferential surface of the window by using a capillary phenomenon. In this apparatus, the surface of the solid material whose outer circumference is a circle can be continuously modified by irradiating light on the surface from the outer circumferential surface of the window. By arranging a plurality of these apparatuses, more effective surface modification can be performed.

Moreover, it is found that when water, an oil, or an adhesive is interposed between fluoroplastic sheets or between a fluoroplastic sheet and a material to be adhered, and ArF excimer laser light is irradiated through the fluoroplastic sheet while closely adhering these materials by pressure, these fluoroplastic sheets or the fluoroplastic sheet and the material to be adhered are strongly chemically adhered to each other according to the present invention. The reason for this is assumed that hydrogen atoms optically dissociated from water ($H_2O$) or oil liberate fluorine atoms from the surface of the fluoroplastic sheet, oxygen atoms dissociated from water or oil are substituted to the positions from which the fluorine atoms are released, and consequently nonbonded hands on the surface of the fluoroplastic sheet have the same oxygen atom in common to give a strong adhesive force.

This similarly applies to an adhesive; that is, it is assumed that hydrogen atoms optically dissociated from an adhesive liberate fluorine atoms from the surface of a fluoroplastic sheet which is simultaneously excited, and nonbonded hands of the adhesive which has lost hydrogen atoms are bonded to the positions from which the fluorine atoms are released, resulting in a strong adhesion force.

According to the present invention, it is also found that an antithrombotic material required for an artificial blood vessel or organ can be readily formed by the use of a fluoroplastic material.

When coherent light radiated from a single light source such as a laser is split into two optical paths and again incident at respective certain angles, interference takes place at the intersection of these light components. Generally, a material coated with a sensitizing agent is placed on this interference portion. In the present invention, however, a transparent window is placed on the surface of a solid material to be treated via a compound liquid film, and ultraviolet laser beams incident through the transparent window from two or more directions are caused to interfere with each other on the interface between the surface of the solid material and the liquid layer. Consequently, only a portion of the surface of the solid material corresponding to the portion of interference is photochemically modified.

Especially when two light beams are incident from two directions while their respective Brewster angles are maintained, only p-polarized light is incident inside the window. This permits high-efficiency modification in the form of a diffraction grating.

Also, a partial side surface of a window is formed into a plane mirror, and ultraviolet radiation is irradiated obliquely from the side away from the side of the plane mirror such that light directly propagating through the window and light reflected by the internal plane mirror interfere with each other. The result is modification in a diffraction-grating form on the surface of the solid material via the window and a thin layer of a compound liquid film. Especially when the angle of incidence of ultraviolet laser light to be obliquely incident is maintained at a Brewster angle, only p-polarized light brings about interference, resulting in a high interference efficiency. When the surface of a material is modified in the form of a grating, e.g., when a hydrophilic group is substituted in a grating form by using a fluoroplastic material as a solid material to be treated, a hydrophilic or hydrophobic micro domain structure is formed. This allows easy formation of an antithrombotic material necessary for an artificial blood vessel or organ by the use of a fluoroplastic material.

As discussed earlier, the angle of contact between a substance to be modified and a liquid is large. For this reason, the contact area with the surface of a sample becomes small, and bubbles generated by photodecomposition further decrease the contact area. As in the present invention, however, by keeping the sample and the glass surface in tight contact with each other and interposing a compound solution between them by using capillarity, an even thin liquid film can be formed on the entire surface of the sample. When ultraviolet radiation is incident from the side of the glass surface, the liquid is locally, optically decomposed, and the surface of the sample is also excited with a fraction of light transmitted through the liquid, bringing about a chemical reaction. Additionally, since the liquid film is thin, all parts of the decomposition product are consumed in the surface treatment, so no excess reaction product which causes generation of bubbles forms. Consequently, no bubbles are generated, making a highly efficient surface treatment possible.

BEST MODE OF CARRYING OUT THE INVENTION

Embodiments of the present invention will be described below with reference to apparatuses illustrated in the drawings.

Figure 1:
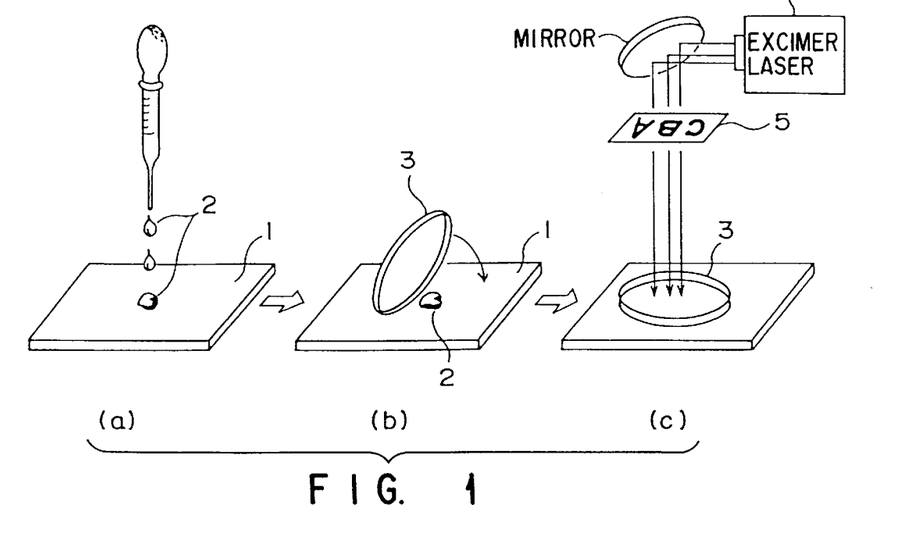
FIG. 1 is a perspective view showing an embodiment of an apparatus for explaining a solid surface modification method according to the present invention.

FIG. 1 shows an embodiment of an apparatus for explaining the method of the present invention. In this apparatus, a compound solution 2 is dropped on a material (sample) 1 to be modified (FIG. 1(*a*)), a synthetic quartz glass plate 3 is placed on the compound solution 2 thus dropped (FIG. 2(*b*)), and a load is applied. Consequently, a thin even liquid film is formed in the gap between the material 1 and the glass plate 3 by a capillary phenomenon. By perpendicularly irradiating an ultraviolet laser beam onto the resultant structure from an excimer laser device 4 through, e.g., a mask 5 as in FIG. 1(*c*), only in the exposed portion the liquid is optically decomposed and the surface of the material 1 is excited, resulting in a chemical reaction occurring between them. Since the liquid film is thin, absorption of the laser beam in the liquid 2 can be suppressed. This allows a large proportion of the ultraviolet radiation to reach the surface of the material 1. Also, since the liquid film is thin, all parts of the decomposition product are used in the surface treatment. Therefore, almost no excess reaction product is formed, which causes generation of bubbles when an ultraviolet laser beam is irradiated on a material to be modified dipped in a compound solution in conventional methods. This makes an effective surface treatment feasible.

Figure 2:
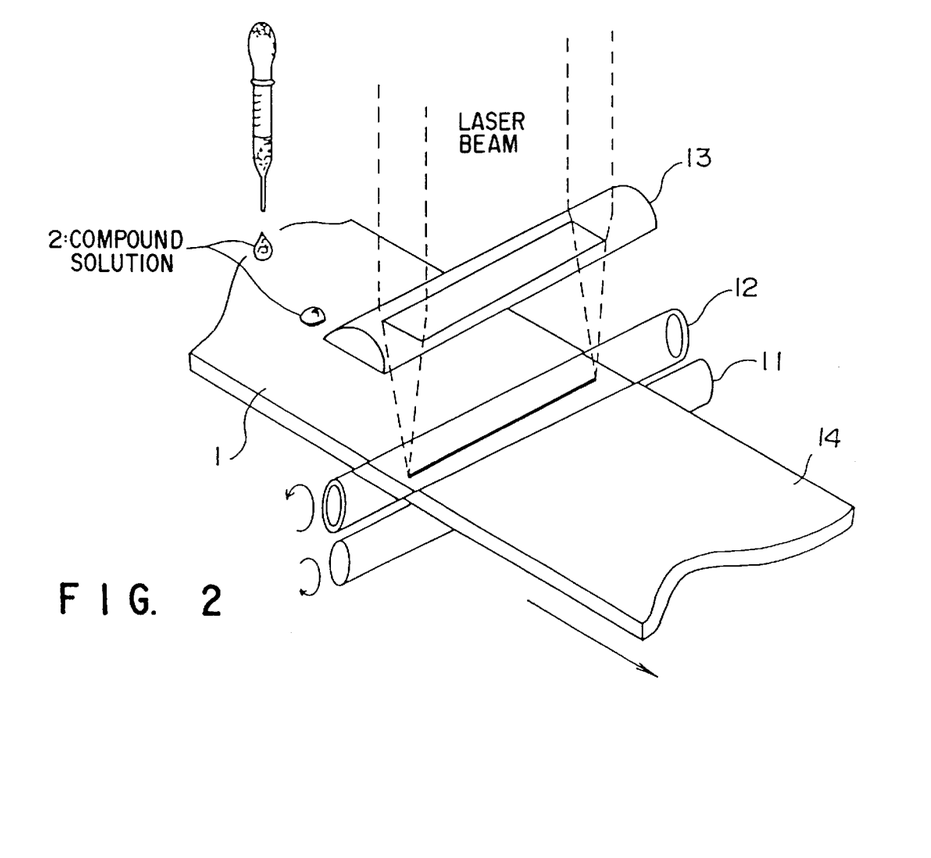
FIG. 2 is a perspective view showing one embodiment of a solid surface modification apparatus according to the present invention.

FIG. 2 shows one embodiment of another apparatus for carrying out the method of the present invention. This apparatus comprises a rotatable rubber roller 11, a cylindrical transparent round rod or transparent pipe 12 capable of rotating and placed parallel to the rubber roller 11, a cylindrical lens 13 arranged above the cylindrical transparent round rod or transparent pipe 12, an illuminating means (not shown) for linearly irradiating, via the cylindrical lens 13, ultraviolet radiation, visible radiation, or infrared radiation to a position at which the rubber roller 11 and the cylindrical transparent round rod or transparent pipe 12 oppose each other, a means (not shown) for passing a sheet-like solid material 14 to be treated through a position between the rubber roller 11 and the cylindrical transparent round rod or transparent pipe 12 in the direction indicated by an arrow, and an urging means for urging the cylindrical transparent round rod or transparent pipe 12 against the rubber roller 11.

In this apparatus, a compound solution 2 as a reaction solution is dropped on the surface of the sheet-like solid material 14 on the upstream side. This compound solution 2 spreads along the lower surface of the cylindrical transparent round rod or transparent pipe 12 by capillarity when the solution reaches the lower surface of the transparent round rod or pipe 12, thereby forming a thin layer. Therefore, by irradiating light (e.g., an ultraviolet laser beam) from the illuminating means onto the upper surface of the solid material 14 in this state, the surface of the sheet-like solid material 14 can be efficiently and continuously modified.

Figure 3:
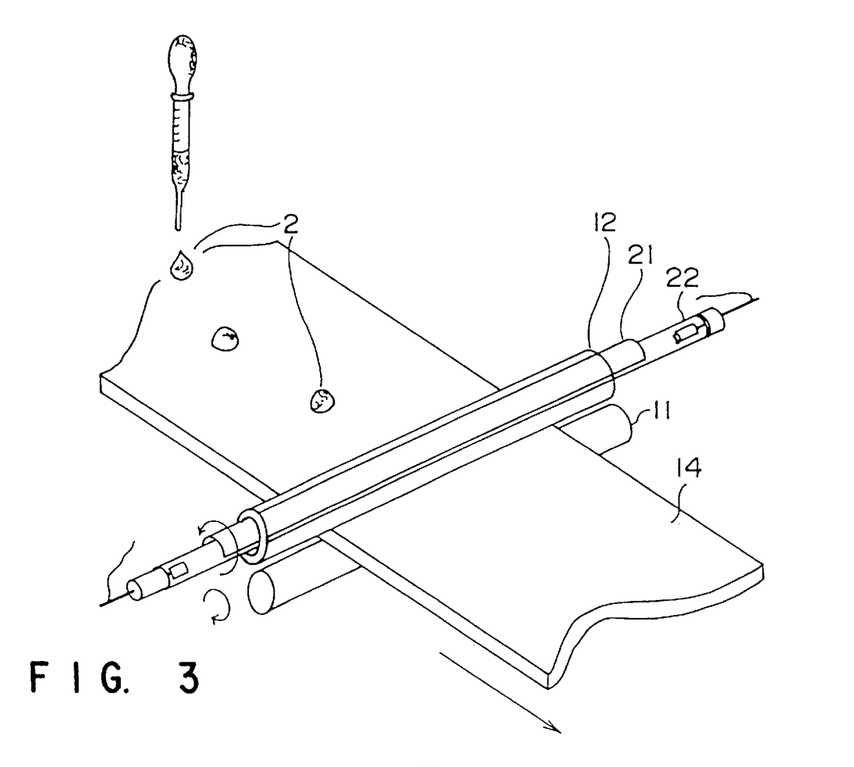
FIG. 3 is a perspective view showing another embodiment of the solid surface modification apparatus according to the present invention.

FIG. 3 shows a modification of the apparatus illustrated in FIG. 2. The difference of this apparatus from that in FIG. 2 is that a reflecting mirror 21 is arranged inside a transparent pipe 12 and an elongated lamp (Hg lamp) 22 is inserted inside the transparent pipe 12. The rest of the arrangement is identical with the apparatus shown in FIG. 2. Therefore, the same reference numerals as in FIG. 2 denote the same parts in FIG. 3, and a detailed description thereof will be omitted.

In this apparatus, as in the apparatus in FIG. 2, a compound solution 2 as a reaction solution is dropped on the surface of a sheet-like solid material 14 to be treated on the upstream side. This compound solution 2 spreads along the lower surface of the transparent pipe 12 by a capillary phenomenon when the solution reaches the lower surface of the pipe 12, thereby forming a thin layer. Therefore, by irradiating light (e.g., an ultraviolet laser beam) from the lamp 22 onto the upper surface of the solid material 14 in this state, the surface of the sheet-like solid material 14 can be efficiently and continuously modified.

When the sheet-like material to be modified is compressed together with the dropped liquid by a synthetic quartz pipe 11 and a rubber roller, a thin straight liquid film is formed in the compressed portion by capillarity. The surface of the material in this state can be continuously modified by irradiating a linear beam which is formed by shaping a laser beam through a lens, or by irradiating the linear liquid film by using a mercury lamp inserted into the synthetic quartz pipe, as shown in FIG. 3. A more effective surface modification is possible by arranging a plurality of these surface modification apparatuses along the sheet-like material to be modified.

Figure 4:
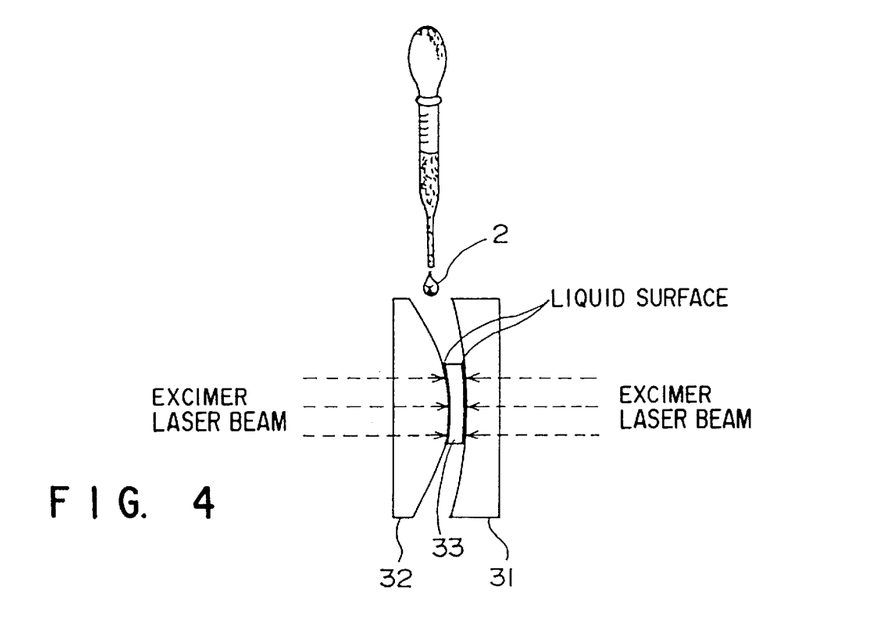
FIG. 4 is a side view showing an embodiment of an apparatus for modifying the surface of a contact lens according to the present invention.

FIG. 4 shows a method of modifying the surface of a lens (e.g., a contact lens) in accordance with the method of the present invention. A lens 33 to be treated (whose curvature is identical or nearly identical with those of a concave lens 31 and a convex lens 32) which is to be subjected to a surface treatment is placed between the concave lens 31 and the convex lens 32. A compound solution 2 is dropped between the lens 33 and the concave lens 31 and between the lens 33 and the convex lens 32, forming thin layers of the compound solution by capillarity. In this state light (e.g., an excimer laser beam) is irradiated on both the surfaces of the lens 33, thereby modifying these surfaces. Consequently, both the surfaces of the lens 33 to be treated can be modified at one time.

EXAMPLE 1

Modification of a fluoroplastic (FEP) sheet was performed by using the apparatus illustrated in FIG. 1. In this example, pure water and tap water were used as the compound solution 2. That is, a thin even liquid film of each of pure water and tap water was formed between the synthetic quartz glass plate 3 and a fluoroplastic (FEP) sheet by pressing the glass plate 3. In this state, an ArF laser beam was irradiated with an energy density of 6.5 mJ/cm$^2$. Consequently, hydrophilicity was brought about for both pure water and tap water, with the result that a contact angle with water of 30° was obtained.

Note that, for comparison, an identical fluoroplastic (FEP) sheet was dipped in the same compound solution, and an ultraviolet laser beam was irradiated to perform surface modification for the fluoroplastic (FEP) sheet. As a result, irradiation of an ArF laser beam with an energy density of 6.5 mJ/cm$^2$ was required to obtain a contact angle with water of 30° when pure water was used, whereas irradiation of an ArF laser beam with an energy density of 15 mJ/cm$^2$ was necessary when tap water was used.

EXAMPLE 2

The apparatus shown in FIG. 1 was used to modify a fluoroplastic (FEP) sheet. In this example, formic acid was used as the compound solution 2. That is, a thin even liquid film of formic acid was formed between the synthetic quartz glass plate 3 and a fluoroplastic (FEP) sheet by pressing the glass plate 3. In this state, an ArF laser beam was irradiated with an energy density of 25 mJ/cm$^2$. Consequently, a contact angle with water of 10° was obtained.

Note that, for comparison, an identical fluoroplastic (FEP) sheet was dipped in formic acid, and an ultraviolet laser beam was irradiated to perform surface modification for the fluoroplastic (FEP) sheet. However, modification was impossible because bubbles were generated.

EXAMPLE 3

A fluoroplastic (PTFE) sheet was modified by using the apparatuses illustrated in FIGS. 2 and 3. That is, continuous surface modification was done by dropping droplets of methylalcohol ($CH_3OH$) one by one on the surface of a fluoroplastic (PTFE) sheet while the fluoroplastic sheet was moved. When an ArF laser beam was irradiated 3000 shots with an energy density of 25 mJ/cm$^2$, a contact angle with water of 45° and a contact angle with benzene of 15° were obtained. This demonstrates that the modified surface had both hydrophilic and lipophilic natures.

EXAMPLE 4

The apparatus illustrated in FIG. 4 was used to modify both the surfaces of a PMMA contact lens. First, liquid films of a solution prepared by dissolving 2 g of ammonia borate [$(NH_4)_2B_4O_7$] in 50 cc of water were formed on both the surfaces of a contact lens by using a capillary phenomenon. In this state, an ArF laser beam was irradiated 1000 shots with an energy density of 20 mJ/cm$^2$ from both the sides of the contact lens. Consequently, a contact angle with water of 10° was obtained, indicating hydrophilicity.

EXAMPLE 5

Surface modification of a silicon wafer was performed by using the apparatus shown in FIG. 1. That is, one droplet of hydrogen peroxide (H$_2$O$_2$) was dropped on the surface of a silicon wafer and pressed by the synthetic quartz glass plate 3, forming a thin even liquid film between the glass plate 3 and the silicon wafer. In this state, an ArF laser beam was irradiated 1000 shots with an energy density of 50 mJ/cm$^2$. Consequently, SiO$_2$ was formed only on the exposed surface. A peak of SiO$_2$ was found at 99 eV by ESCA.

EXAMPLE 6

Surface modification of aluminum was performed by using the apparatus shown in FIG. 1. That is, one droplet of hydrogen peroxide (H$_2$O$_2$) was dropped on the surface of aluminum and pressed by the synthetic quartz glass plate 3, forming a thin even liquid film between the glass plate 3 and the aluminum. In this state, an ArF laser beam was irradiated 1000 shots with an energy density of 50 mJ/cm$^2$. Consequently, Al$_2$O$_3$ was formed only on the exposed surface. When the surface of the material thus treated was dipped in an aqueous NaOH solution, the Al$_2$O$_3$ portion was not corroded.

EXAMPLE 7

Figure 5:
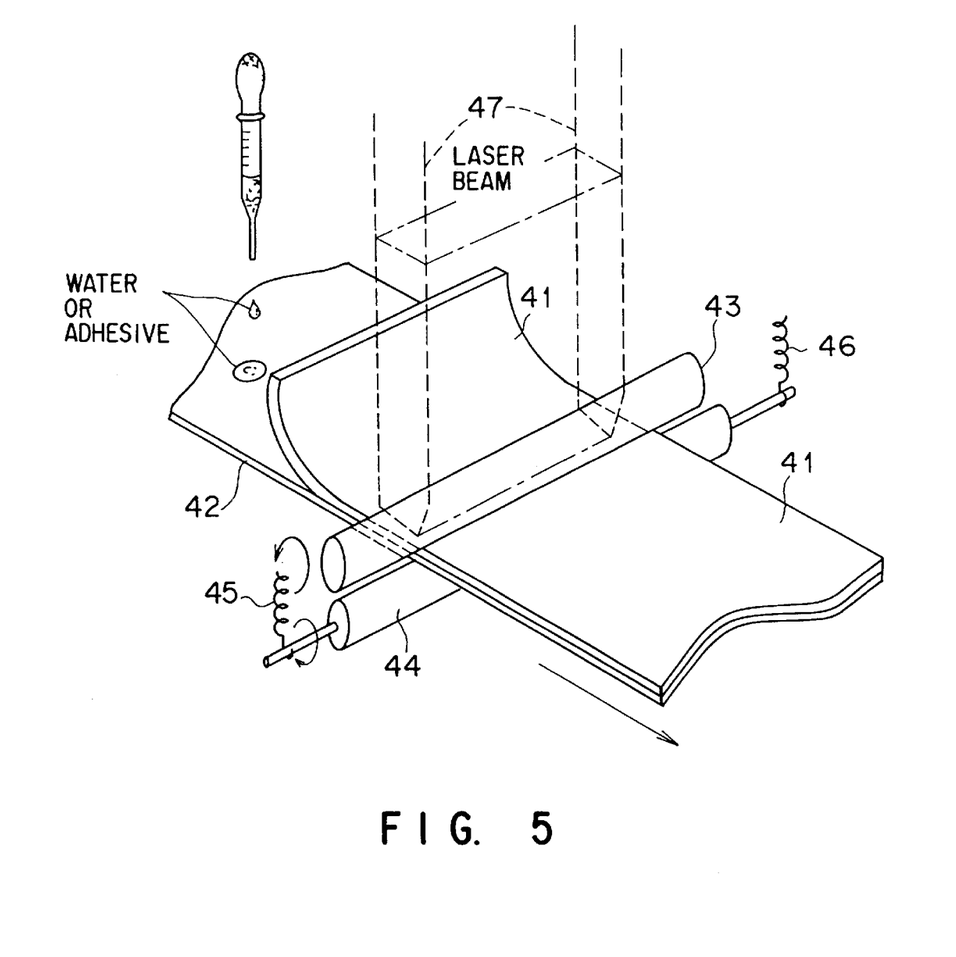
FIG. 5 is a perspective view showing still another embodiment of the solid surface modification apparatus according to the present invention.

An apparatus illustrated in FIG. 5 was used to bond two fluoroplastic sheets (FEP) with pure water or tap water. In FIG. 5, reference numeral 43 denotes a synthetic quartz round rod lens constituting a cylindrical lens; 44, a roller for urging members to be treated against the synthetic quartz round rod lens 43; 45 and 46, pressure springs attached to the two ends of the roller; 41 and 42, fluoroplastic sheets as the members to be treated; and 47, a rectangular Arf excimer laser beam.

First, one droplet of pure water was dropped between the two fluoroplastic sheets 41 and 42. Continuous bonding was then performed by urging the synthetic quartz round rod lens 43 constituting the cylindrical lens against the roller 44 while moving the sheets 41 and 42. When the rectangular ArF excimer laser beam was incident from the circumferential portion of the synthetic quartz round rod lens 43, a linear beam was obtained on the surface where the round rod lens 43 and the fluoroplastic sheet 41 were in contact. Note that the laser beam was incident with an energy density of 50 mJ/cm$^2$ and a repetition pulse rate of 3000 shots while the pressure between the two fluoroplastic sheets 41 and 42 was held at 10 kgf/cm$^2$. The resultant sample was subjected to a tensile shear test and found to have an adhesive strength of 30 kgf/cm$^2$.

The same test was conducted by using tap water instead of pure water. As a result, nearly the same adhesive strength as in the case of pure water was obtained.

EXAMPLE 8

The apparatus shown in FIG. 5 was used in this example. First, a thin layer of an epoxy adhesive was coated between a stainless steel plate and a fluoroplastic sheet (FEP). While the synthetic quartz round rod lens 43 was urged against the roller 44, a laser beam with an energy density of 40 mJ/cm$^2$ was irradiated on the interface between the fluoroplastic sheet and the adhesive at a repetition pulse rate of 6000 shots. Thereafter, the adhesive was cured at 80° C. for 15 hours, and the resultant sample was subjected to a tensile shear test. Consequently, the adhesive strength that was 1 kgf/cm$^2$ or less before the laser beam was irradiated was improved to 84 kgf/cm$^2$ after irradiation of the laser beam.

EXAMPLE 9

The apparatus illustrated in FIG. 5 was used. First, one droplet of a cyanol-based instant adhesive (Aron Alpha (tradename)) was dropped between an acryl plate and a fluoroplastic sheet (FEP). While the synthetic quartz round rod lens 43 was urged against the roller 44, a laser beam with an energy density of 30 mJ/cm$^2$ was irradiated on the interface between the fluoroplastic sheet and the adhesive at a repetition pulse rate of 7000 shots. The resultant sample was subjected to a tensile shear test. Consequently, the adhesive strength that was 0.2 kgf/cm$^2$ or less before the laser beam was irradiated was improved to 25 kgf/cm$^2$ after irradiation of the laser beam.

Note that when a slight amount of acetic acid was mixed in the cyanol-based instant adhesive described above, the cure time was lengthened to improve the workability. Since this made repetitive laser irradiation for a long time period possible, the tensile shear strength was improved to 40 kgf/cm$^2$ after irradiation of 10,000 shots.

EXAMPLE 10

One droplet of water was dropped on a fluoroplastic plate, and a quartz glass plate was kept in tight contact with the fluoroplastic plate. Thereafter, ArF laser beams (energy density 10 mJ/cm$^2$, repetition pulse rate 3000 shots) split into two optical paths were guided to cross each other on the interface between the material to be treated and water through a plate synthetic quartz window, while the angle of incidence with the quartz window was held at 33°. Consequently, it was found from measurements made by SEM and EPMA that portions modified to have hydrophilicity were formed at intervals of 2123 Å.

EXAMPLE 11

A side surface of disk-like synthetic quartz glass was ground and polished, and Al was vapor-deposited only on that surface, thereby making a window having an internal plane mirror. The resultant window was kept in tight contact with the surface of a fluoroplastic sheet (FEP) via water. An ArF laser beam (energy density: 10 mJ/cm$^2$, repetition pulse rate: 3000 shots) was caused to be incident from the side away from the side of the internal plane mirror with an angle of 33° held with respect to the window, such that a half of the beam was reflected by the plane mirror. Consequently, it was found from measurements done by SEM and EPMA that there were portions in which the light reflected by the internal plane mirror of the window and the light directly propagating through the window crossed each other, i.e., portions modified to have hydrophilicity due to photochemical substitution on the interface between the material and water, at intervals of 2123 Å.

EXAMPLE 12

Figure 6:
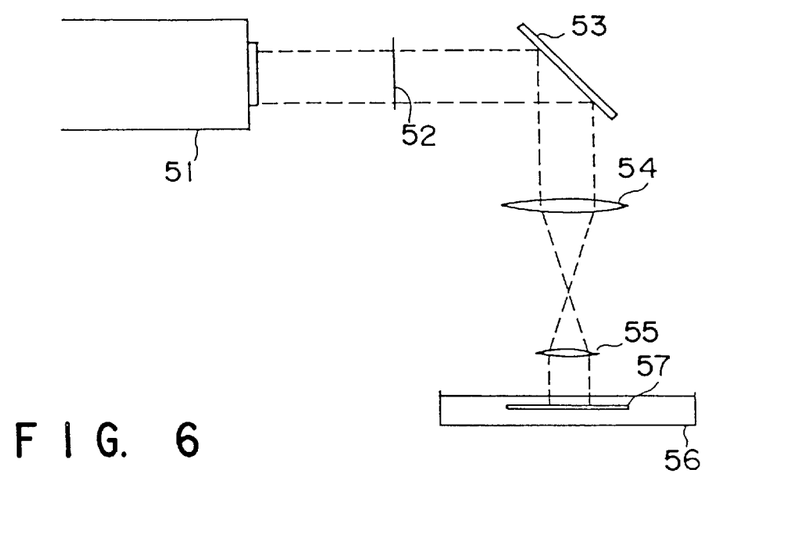
FIG. 6 is a schematic view showing a fluoroplastic surface treatment apparatus used to carry out the method of the present invention.

An apparatus shown in FIG. 6 was used to perform a surface treatment for a fluoroplastic material (polytetrafluoroethylene). In FIG. 6, reference numeral 51 denotes an excimer laser device; 52, a mask; 53, a mirror; 54 and 55, lenses; 56, a reactor vessel; and 57, a fluoroplastic sheet as a sample.

Figure 7:
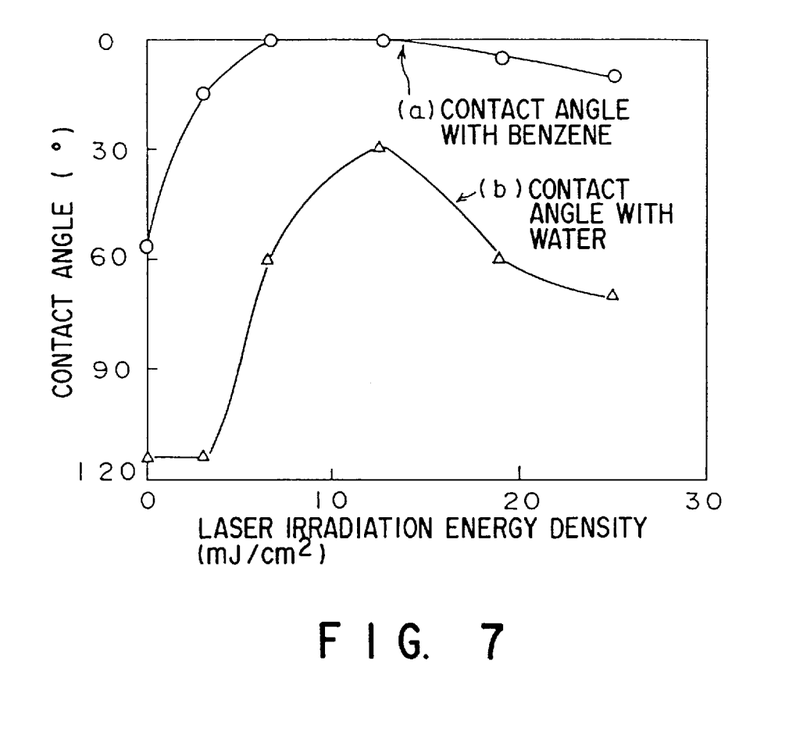
FIG. 7 is a graph showing the characteristics of the surface of a fluoroplastic treated by the method of the present invention.

To begin with, a solution prepared by dissolving 50 cc of methylalcohol ($CH_3OH$) and 5 g of sodium tetrahydroborate ($Na[BH_4]$) was placed in the reactor vessel 56. The fluoroplastic sheet 57 was dipped in the solution, and an ArF laser beam was irradiated on the interface between the solution and the fluoroplastic sheet 57. As a result, both a lipophilic group and a hydrophilic group were found as shown in FIG. 7. That was confirmed from the results of measurements of infrared absorption spectra using ATR-FTIR; that is, substitution of a methyl group was confirmed by absorption near 2900 $cm^{-1}$, and substitution of a hydroxyl group was confirmed by absorption near 3300 $cm^{-1}$. Also, defluorination was confirmed by X-ray photoelectron spectroscopy (XPS). The fluoroplastic sheet 57 thus treated was bonded to a stainless steel plate with an epoxy resin-based adhesive and subjected to a tensile shear test. The adhesive strength was found to be 140 $kgf/cm^2$.

EXAMPLE 13

Figure 8:
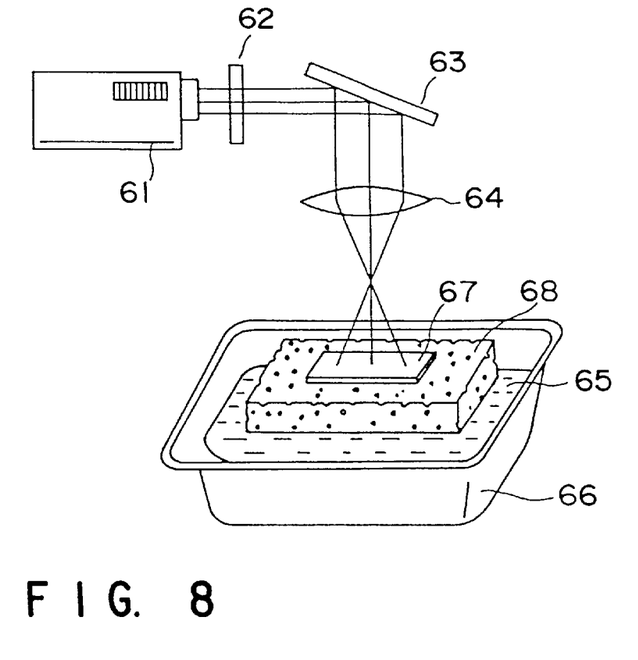
FIG. 8 is a perspective view showing a fluoroplastic surface treatment apparatus used to carry out the method of the present invention.

An apparatus illustrated in FIG. 8 was used to perform a surface treatment for a fluoroplastic material (FEP). In FIG. 8, reference numeral 61 denotes an excimer laser device; 62, a mask; 63, a mirror; 64, a lens; 65, a compound liquid; 66, a reactor vessel; 67, a fluoroplastic sheet as a sample; and 68, a sponge sheet.

Figure 9:
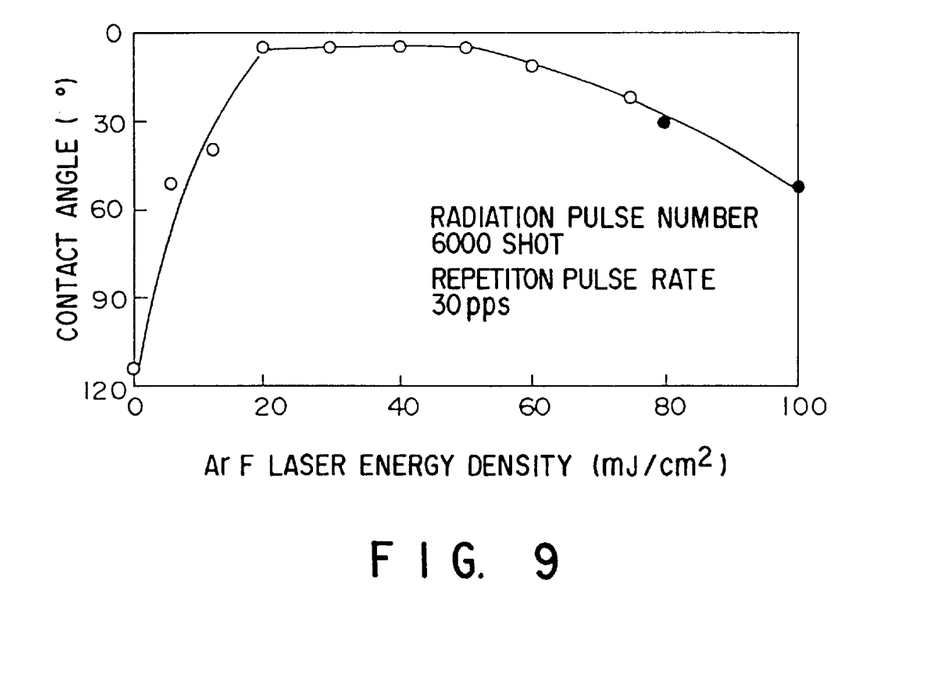
FIG. 9 is a graph showing the characteristics of the surface of a fluoroplastic treated by the method of the present invention.

First, 5 g of sodium tetrahydroborate were dissolved in 50 cc of water, and the sponge sheet 68 was soaked with the resultant solution 65. This prevents generation of bubbles and removal of the liquid from the fluoroplastic sheet sample 67. Thereafter, the transparent fluoroplastic (FEP) sheet sample 67 was placed on the sponge sheet 68, and an ArF laser beam (10 $mJ/cm^2$) was irradiated from above. Consequently, as in FIG. 9, the contact angle with water which was 110° before the treatment was improved to 10° after that. The resultant surface-modified fluoroplastic sheet material was bonded to a stainless steel plate with Aron Alpha (tradename), and it was found that the adhesive strength was 60 $kgf/cm^2$.

EXAMPLE 14

2 g of boric acid ($H_3BO_3$) were dissolved in 50 cc of water, a sponge sheet was soaked with the resultant solution, and a fluoroplastic (FEP) sheet sample was treated following the same procedures as in Example 13. Consequently, a hydroxyl group (OH) was substituted on the surface of the fluoroplastic sheet sample with an ArF laser energy density of 15 $mJ/cm^2$, resulting in a contact angle with water of 5°. When this surface-modified fluoroplastic sheet sample was bonded to a stainless steel plate with Aron Alpha (tradename), the adhesive strength was found to be 60 $kgf/cm^2$.

EXAMPLE 15

2 g of boric acid ($H_3BO_3$) were dissolved in 50 cc of ammonia water, a sponge sheet was soaked with the resultant solution, and a transparent fluoroplastic (FEP) sheet sample was treated following the same procedures as in Example 13. Consequently, an amino group ($—NH_2$) was substituted on the surface of the fluoroplastic sheet sample to give rise to hydrophilicity. As a result of measurements of infrared absorption spectra using ATR-FTIR, the substitution of an amino group was confirmed by absorption of NH near 3500 $cm^{-1}$. Also, defluorination was confirmed by X-ray photoelectron spectroscopy (XPS). At that time, the ArF laser energy density was 20 $mJ/cm^2$, and the contact angle with water was 5°. This surface-modified fluoroplastic sheet sample was bonded to a stainless steel plate with an epoxy resin-based adhesive and subjected to a tensile shear test. The adhesive strength was found to be 140 $kgf/cm^2$.

EXAMPLE 16

A solution prepared by dissolving 2 g of boric acid ($H_3BO_3$) in 50 cc of methylalcohol was placed in the reactor vessel 56 shown in FIG. 6. A fluoroplastic sheet sample was dipped in the solution, and a 15-$mJ/cm^2$ ArF excimer laser beam was irradiated on the interface between the solution and the sample. Consequently, the contact angle with benzene was 10°, indicating a lipophilic nature. This surface-modified fluoroplastic sheet sample was bonded to a stainless steel plate with an epoxy resin-based adhesive and subjected to a tensile shear test. The adhesive strength was found to be 120 $kgf/cm^2$.

EXAMPLE 17

A solution prepared by dissolving 2 g of boric acid ($H_3BO_3$) in 50 cc of toluene ($C_6H_6 \cdot CH_3$) was placed in the is reactor vessel 56 illustrated in FIG. 6. Following the same procedures as in Example 12, a fluoroplastic sheet sample was dipped in the solution, and an ArF laser beam was irradiated on the interface between the solution and the sample. Consequently, a lipophilic group nearly identical with that in Example 12 was found. The fluoroplastic sheet thus treated was bonded to a stainless steel plate with an epoxy resin-based adhesive and subjected to a tensile shear test. The resultant adhesive strength was found to be 140 $kgf/cm^2$.

EXAMPLE 18

2 g of aluminum hydroxide ($Al(OH)_3$) were dissolved in an aqueous 0.1 N NaOH solution. Following the same procedures as in Example 13, a sponge sheet was soaked with the resultant solution, a transparent fluoroplastic (FEP) sheet sample was placed on the sponge sheet, and an ArF laser beam (10 $mJ/cm^2$) was irradiated from above. As a result, hydrophilicity similar to that in Example 13 was found. This surface-modified fluoroplastic sheet sample was bonded to a stainless steel plate with Aron Alpha (tradename), and the resultant adhesive strength was found to be 60 $kgf/cm^2$.

EXAMPLE 19

A liquid of trimethoxyboron ($B(OCH_3)_3$) was placed in the reactor vessel 56 illustrated in FIG. 6. Following the same procedures as in Example 12, a fluoroplastic sheet sample was dipped in the solution, and an ArF laser beam was irradiated on the interface between the solution and the sample. The result was that a contact angle nearly identical with that in Example 12 was obtained. The fluoroplastic sheet thus treated was bonded to a stainless steel plate with an epoxy resin-based adhesive and subjected to a tensile shear test. The adhesive strength was found to be 140 $kgf/cm^2$.

EXAMPLE 20

2 g of barium hydroxide ($Ba(OH)_2$) were dissolved in 50 cc of water, and a sponge sheet was soaked with the solution. A transparent fluoroplastic (FEP) sheet sample was placed on the sponge sheet, and an ArF laser beam (20 $mJ/cm^2$) was irradiated from above. Consequently, hydrophilicity analogous to that in Example 13 was found. When this surface-modified fluoroplastic sheet sample was bonded to a stainless steel plate with Aron Alpha (tradename), the adhesive strength was found to be 30 kgf/cm$^2$.

EXAMPLE 21

2 g of gallium acetate (Ga(CH$_3$COO)$_3$) were dissolved in 50 cc of water, and a sponge sheet was soaked with the solution. A transparent fluoroplastic (FEP) sheet sample was placed on the sponge sheet, and an ArF laser beam (20 mJ/cm$^2$) was irradiated from above. Consequently, hydrophilicity analogous to that in Example 13 was found. When this surface-modified fluoroplastic sheet sample was bonded to a stainless steel plate with Aron Alpha (tradename), the adhesive strength was found to be 25 kgf/cm$^2$.

EXAMPLE 22

2 g of lithium acetate (LiCH$_3$COO) were dissolved in 50 cc of methyl alcohol, and a sponge sheet was soaked with the solution. A transparent fluoroplastic (FEP) sheet sample was placed on the sponge sheet, and an ArF laser beam (20 mJ/cm$^2$) was irradiated from above. Consequently, hydrophilicity analogous to that in Example 13 was found. When this surface-modified fluoroplastic sheet sample was bonded to a stainless steel plate with Aron Alpha (tradename), the adhesive strength was found to be 20 kgf/cm$^2$.

EXAMPLE 23

A sponge sheet was soaked with pure water (H$_2$O), a transparent fluoroplastic (FEP) sheet sample was placed on the sponge sheet, and an ArF laser beam (20 mJ/cm$^2$) was irradiated from above. As a result, hydrophilicity similar to that in Example 13 was found. When this surface-modified fluoroplastic sheet sample was bonded to a stainless steel plate with Aron Alpha (tradename), the adhesive strength was found to be 20 kgf/cm$^2$. Note that almost identical results were obtained when identical experiments were done by using tap water in place of pure water.

EXAMPLE 24

A sponge sheet was soaked with formic acid (HCOOH), a transparent fluoroplastic (FEP) sheet sample was placed on the sponge sheet, and an ArF laser beam (25 mJ/cm$^2$) was irradiated from above. As a result, hydrophilicity similar to that in Example 13 was found. When this surface-modified fluoroplastic sheet sample was bonded to a stainless steel plate with Aron Alpha (tradename), the adhesive strength was found to be 25 kgf/cm$^2$.

EXAMPLE 25

A solution prepared by dissolving 2 g of tetrabenzyltitanium Ti(CH$_2$C$_6$H$_5$)$_4$ in 50 cc of hexane (C$_6$H$_{14}$) was placed in the reactor vessel 56 shown in FIG. 6. Following the same procedures as in Example 12, a fluoroplastic (FEP) sheet sample was dipped in the solution, and an ArF laser beam was irradiated on the interface between the solution and the sample. Consequently, a lipophilic nature similar to that in Example 12 was found. This surface-modified fluoroplastic sheet sample was bonded to a stainless steel plate with an epoxy resin-based adhesive and subjected to a shear test. The resultant adhesive strength was found to be 65 kgf/cm$^2$.

EXAMPLE 26

A sponge sheet was soaked with formic acid (HCOOH), and a transparent fluoroplastic (FEP) sheet sample was placed on the sponge sheet. A 100-W low-pressure mercury lamp beam which was condensed (to have a diameter of about 10 mm) by a reflecting mirror with a toroidal surface and a lens was irradiated from above for 3 minutes. As a result, hydrophilicity analogous to that in Example 13 was found. When this surface-modified fluoroplastic sheet sample was bonded to a stainless steel plate with Aron Alpha (tradename), the adhesive strength was found to be 20 kgf/cm$^2$.

EXAMPLE 27

2 g of boric acid (H$_3$BO$_3$) were dissolved in 50 cc of water. A thin liquid film of the resultant solution was kept in tight contact with a methacrylic resin (PMMA) sheet sample, and a KrF laser beam (20 mJ/cm$^2$, 100 shots) was irradiated on the resultant structure. Consequently, a hydroxyl group was substituted only in the exposed portion, and (OH) was found near 3300 cm$^{-1}$ as a result of ATR infrared spectroscopy.

EXAMPLE 28

2 g of amide sulfate (SO$_2$(NH$_2$)$_2$) were dissolved in 50 cc of water. A thin liquid film of the resultant solution was kept in tight contact with a methacrylic resin (PMMA) sheet sample, and a KrF laser beam (20 mJ/cm$^2$, 300 shots) was irradiated on the resultant structure. Consequently, an amino group was substituted only in the exposed portion, and the contact angle with water was found to be 20°, indicating hydrophilicity.

EXAMPLE 29

2 g of sodium platinum hexahydroxo (Na$_2$Pt(OH)$_6$) were dissolved in 50 cc of water. A thin liquid film of the resultant solution was kept in tight contact with a methacrylic resin (PMMA) sheet sample, and a KrF laser beam (20 mJ/cm$^2$, 300 shots) was irradiated on the resultant structure. Consequently, a hydroxyl group was substituted only in the exposed portion, and the contact angle with water was found to be 20°, indicating hydrophilicity.

EXAMPLE 30

0.1-g cyanogen bromide (CNBr) was dissolved in 10 cc of water. A thin liquid film of the resultant solution was kept in tight contact with a methacrylic resin (PMMA) sheet sample, and a KrF laser beam (20 mJ/cm$^2$, 300 shots) was irradiated on the resultant structure. As a consequence, a cyan group was substituted only in the exposed portion, and a peak indicating a triple bond of C and N was found near 2100 cm$^{-1}$ as a result of ATR infrared spectroscopy.

EXAMPLE 31

2-g aluminum chloride (AlCl$_3$) was dissolved in 100-cc ethanol. A thin liquid film of the resultant solution was kept in tight contact with a polyethylene sheet sample, and an ArF laser beam (20 mJ/cm$^2$, 1000 shots) was irradiated on the resultant structure. Thereafter, the modified surface was subjected to ESCA spectroscopy. The result was that a peak of Al was found at 71 eV, indicating that Al was substituted in the sample.

EXAMPLE 32

A thin liquid film of fluorocarbon 112 (CCl$_2$FCCl$_2$F) was kept in tight contact with a polyethylene film sample, and an ArF laser beam (35 mJ/cm$^2$, 500 shots) was irradiated on the resultant structure. As a result, the contact angle with water was found to be 100° only in the exposed portion, demonstrating that the surface was converted into teflon.

EXAMPLE 33

A thin liquid film of water ($H_2O$) was kept in tight contact with a polyethylene film sample, and an ArF laser beam (25 mJ/cm$^2$, 3000 shots) was irradiated on the resultant structure. Consequently, the contact angle with water was found to be 15° only in the exposed portion, indicating that the surface was modified to be hydrophilic.

EXAMPLE 34

A thin liquid film of pure water ($H_2O$) was kept in tight contact with a polyphenylenesulfide (PPS) film sample, and an ArF laser beam (12.5 mJ/cm$^2$, 3000 shots) was irradiated on the resultant structure. Consequently, the contact angle with water was found to be 30° only in the exposed portion, indicating that the surface was modified to be hydrophilic.

EXAMPLE 35

A thin liquid film of pure water ($H_2O$) was kept in tight contact with a methacrylic resin (PMMA) film sample, and an ArF laser beam (12.5 mJ/cm$^2$, 9000 shots) was irradiated on the resultant structure. Consequently, the contact angle with water was found to be 40° only in the exposed portion, indicating that the surface was modified to be hydrophilic.

EXAMPLE 36

A thin liquid film of pure water ($H_2O$) was kept in tight contact with an acrylonitrile butadiene styrene (ABS) film sample, and an ArF laser beam (12.5 mJ/cm$^2$, 3000 shots) was irradiated on the resultant structure. Consequently, the contact angle with water was found to be 10° only in the exposed portion, indicating that the surface was modified to be hydrophilic.

EXAMPLE 37

A thin liquid film of pure water ($H_2O$) was kept in tight contact with a polycarbonate resin film sample, and an ArF laser beam (12.5 mJ/cm$^2$, 3000 shots) was irradiated on the resultant structure. Consequently, the contact angle with water was found to be 30° only in the exposed portion, indicating that the surface was modified to be hydrophilic.

EXAMPLE 38

A thin liquid film of pure water ($H_2O$) was kept in tight contact with a nylon.6 resin film sample, and an ArF laser beam (12.5 mJ/cm$^2$, 3000 shots) was irradiated on the resultant structure. Consequently, the contact angle with water was found to be 35° only in the exposed portion, indicating that the surface was modified to be hydrophilic.

EXAMPLE 39

A thin liquid film of pure water ($H_2O$) was kept in tight contact with a nylon.66 resin film sample, and an ArF laser beam (12.5 mJ/cm$^2$, 3000 shots) was irradiated on the resultant structure. Consequently, the contact angle with water was found to be 35° only in the exposed portion, indicating that the surface was modified to be hydrophilic.

EXAMPLE 40

A thin liquid film of formic acid (HCOOH) was kept in tight contact with a polyphenylenesulfide (PPS) film sample, and a KrF laser beam (12.5 mJ/cm$^2$, 3000 shots) was irradiated on the resultant structure. Consequently, the contact angle with water was found to be 25° only in the exposed portion, indicating that the surface was modified to be hydrophilic.

EXAMPLE 41

A thin liquid film of formic acid (HCOOH) was kept in tight contact with a polyethylene film sample, and an ArF laser beam (12.5 mJ/cm$^2$, 3000 shots) was irradiated on the resultant structure. Consequently, the contact angle with water was found to be 35° only in the exposed portion, indicating that the surface was modified to be hydrophilic.

EXAMPLE 42

A thin liquid film of formic acid (HCOOH) was kept in tight contact with an acrylonitrile butadiene styrene resin (ABS) film sample, and a KrF laser beam (12.5 mJ/cm$^2$, 2000 shots) was irradiated on the resultant structure. Consequently, the contact angle with water was found to be 5° only in the exposed portion, indicating that the surface was modified to be hydrophilic.

EXAMPLE 43

A thin liquid film of formic acid (HCOOH) was kept in tight contact with a polycarbonate resin film sample, and a KrF laser beam (12.5 mJ/cm$^2$, 2000 shots) was irradiated on the resultant structure. Consequently, the contact angle with water was found to be 15° only in the exposed portion, indicating that the surface was modified to be hydrophilic.

EXAMPLE 44

A thin liquid film of formic acid (HCOOH) was kept in tight contact with a nylon.6 resin film sample, and a KrF laser beam (12.5 mJ/cm$^2$, 2000 shots) was irradiated on the resultant structure. Consequently, the contact angle with water was found to be 30° only in the exposed portion, indicating that the surface was modified to be hydrophilic.

EXAMPLE 45

A thin liquid film of formic acid (HCOOH) was kept in tight contact with a nylon.66 resin film sample, and a KrF laser beam (12.5 mJ/cm$^2$, 2000 shots) was irradiated on the resultant structure. Consequently, the contact angle with water was found to be 30° only in the exposed portion, indicating that the surface was modified to be hydrophilic.

EXAMPLE 46

2-g ammonia fluoride ($NH_4F$) was dissolved in 50-cc water. A thin liquid film of the resultant solution was kept in tight contact with a polyethylene film, and an ArF laser beam (12.5 mJ/cm$^2$, 3000 shots) was irradiated on the resultant structure. As a result, an amino group was substituted only in the exposed portion, and the contact angle with water was found to be 15°, indicating hydrophilicity.

EXAMPLE 47

A thin liquid film of formic acid (HCOOH) was kept in tight contact with a polyethylene film, and light of a 300-W Hg—Xe lamp was irradiated on the resultant structure for 3 minutes. As a consequence, the contact angle with water was found to be 35° only in the exposed portion, demonstrating that the surface was modified to be hydrophilic.

EXAMPLE 48

A thin liquid film of formic acid (HCOOH) was kept in tight contact with a polyethylene film. Arc discharge (AC) of 9000 V was generated in a 0.5-mm electrode gap in an $N_2$ atmosphere at 2 atm, and the emitted light was irradiated for 10 minutes. Consequently, the contact angle with water was found to be 35°, demonstrating that the surface was modified to be hydrophilic.

EXAMPLE 49

A PTFE porous sheet with a thickness of 60 μm, a nominal pore size of 0.1 μm, a porosity of 75%, and dimensions of 10 by 10 cm was dipped in methanol and water in this order for 10 minutes each and then dipped in an aqueous compound solution for another 10 minutes, impregnating pores with the aqueous compound solution. As the aqueous compound solution, an aqueous 4.1-wt % boric acid solution was used. In this aqueous solution impregnated state, an ArF laser was repeatedly irradiated at an energy density of 200 mJ/cm² and a rate of 50 pulses/second for 120 seconds. The resultant material was washed with pure water and dried to obtain a hydrophilic fluoroplastic porous film.

When this film was dipped in pure water, the film rapidly absorbed water.

The film was then subjected to surface analysis in accordance with ESCA (Electron Spectroscopy for Chemical Analysis). The result was that the O/C ratio that was 0 before the treatment for imparting hydrophilicity was improved to 0.18 after the treatment. In addition, the values of F/C before and after the treatment were found to be 2.0 and 0.28, respectively, indicating that fluorine atoms were substituted by hydrophilic groups. Waveform analysis was also made. Consequently, assuming the number of carbon atoms of a —$CF_2$— bond (292 eV) is 100, that of a —C—O— bond (286 eV) was 63, and that of —C=O (288 eV) was 11. This indicates the presence of hydrophilic functional groups. No such functional groups were present before the treatment.

Even after the film was dipped in each of fluoric acid (50 wt %), hydrochloric acid (36 wt %), and sulfuric acid (97 wt %) at room temperature for 1 day, washed with water, and dried, the film maintained its hydrophilicity. Also, the film maintained the hydrophilicity even after being washed with each of ethanol and acetone and dried.

The above hydrophilic fluoroplastic porous film was subjected to a water permeation test at a pressure difference of 235 mmHg, and the result was that the permeation flow rate of pure water was 3.5 cm³/cm²/min. The value of a film not subjected to the treatment of imparting hydrophilicity was 0, since the film did not get wet with pure water. The permeation flow rate of pure water measured after the film was wetted with ethanol was 3.5 cm³/cm²/min. That is, no lowering was found in the permeation flow rate of the film after the treatment.

This hydrophilic fluoroplastic porous film was brought into contact with tetraethoxysilane, washed, and observed with an X-ray microanalyzer. As a result, it was found that Si atoms were present in the pores of the porous body, indicating that the film was given hydrophilicity.

EXAMPLE 50

A laser was irradiated following the same procedures as in Example 49 except that an aqueous 2 N lithium hydroxide solution was used as a compound solution. Even after being washed and dried, the resultant film absorbed water when dipped in pure water. Also, the film properties were nearly identical with those in Example 49.

EXAMPLE 51

A laser was irradiated following the same procedures as in Example 49 except that an aqueous solution mixture of 1 N aluminum hydroxide and 1 N sodium hydroxide was used as a compound solution. More specifically, the film impregnated with the solution was dipped in the solution, and an ArF laser was repeatedly irradiated at an energy density of 100 mJ/cm² and a pulse rate of 50 pulses/second for 40 seconds. Even after being washed and dried, the resultant film absorbed water when dipped in pure water. Also, the film properties were nearly identical with those in Example 49.

EXAMPLE 52

A PTFE porous sheet with a thickness of 60 μm, a nominal pore size of 0.1 μm, a porosity of 75%, and dimensions of 10 by 10 cm was dipped in methanol and water in this order for 10 minutes each and then dipped in an aqueous compound solution for another 10 minutes, impregnating pores with the aqueous compound solution. As the aqueous compound solution, an aqueous 4.1-wt % boric acid solution was used. In this aqueous solution impregnated state, a 50-W low-pressure mercury lamp was irradiated for 60 seconds. The resultant material was washed with pure water and dried to obtain a hydrophilic fluoroplastic porous film.

When this film was dipped in pure water, the film rapidly absorbed water.

The film was then subjected to surface analysis in accordance with ESCA (Electron Spectroscopy for Chemical Analysis). The result was that the O/C ratio that was 0 before the treatment for imparting hydrophilicity was improved to 0.18 after the treatment. In addition, the values of F/C before and after the treatment were found to be 2.0 and 0.28, respectively, indicating that fluorine atoms were substituted by hydrophilic groups. Waveform analysis was also made. Consequently, assuming the number of carbon atoms of a —$CF_2$— bond (292 eV) is 100, that of a —C—O— bond (286 eV) was 81, and that of —C=O (288 eV) was 18. This indicates the presence of hydrophilic functional groups. No such functional groups were present before the treatment.

Even after the film was dipped in each of fluoric acid (50 wt %), hydrochloric acid (36 wt %), and sulfuric acid (97 wt %) at room temperature for 1 day, washed with water, and dried, the film maintained its hydrophilicity. Also, the film maintained the hydrophilicity even after being washed with each of ethanol and acetone and dried.

The above hydrophilic fluoroplastic porous film was subjected to a water permeation test at a pressure difference of 235 mmHg, and the result was that the permeation flow rate of pure water was 3.7 cm³/cm²/min. The value of a film not subjected to the treatment of imparting hydrophilicity was 0, since the film did not get wet with pure water. The permeation flow rate of pure water measured after the film was wetted with ethanol was 3.7 cm³/cm²/min. That is, no lowering was found in the permeation flow rate of the film after the treatment.

This hydrophilic fluoroplastic porous film was brought into contact with tetraethoxysilane, washed, and observed with an X-ray microanalyzer. As a result, it was found that Si atoms were present in the pores of the porous body, indicating that the film was given hydrophilicity.

EXAMPLE 53

Ultraviolet radiation was irradiated using a low-pressure mercury lamp following the same procedures as in Example 52 except that an aqueous 2 N lithium hydroxide solution was used as a compound solution. Even after being washed and dried, the resultant film absorbed water when dipped in pure water. Also, the film properties were nearly identical with those in Example 52.

EXAMPLE 54

Ultraviolet radiation was irradiated using a low-pressure mercury lamp following the same procedures as in Example 52 except that an aqueous solution mixture of 1 N aluminum hydroxide and 1 N sodium hydroxide was used as a compound solution. More specifically, the film impregnated with the solution was dipped in the solution, and ultraviolet radiation was irradiated by using a 100-W low-pressure mercury lamp or a 2-kW high-pressure mercury lamp. Even after being washed and dried, the resultant film absorbed water when dipped in pure water. Also, the film properties were nearly identical with those in Example 52.

EXAMPLE 55

A nonporous PTFE film (Nitoflon Tape No. 900 (tradename) 38 μm thick, manufactured by NITTO DENKO CORP.) was irradiated with ultraviolet radiation in the same compound solution as in Example 51. The contact angle with pure water of the resultant film was found to be 55°, indicating that the film was modified to be hydrophilic. The angle was 120° before the treatment.

A double-sided adhesive tape (No. 500 manufactured by NITTO DENKO CORP.) was adhered to the hydrophilic surface of the film at the contact side with the solution. The adhesive strength (JIS Z 0237) as measured by a 180° peel-back method was found to be 13 times as large as that before the irradiation.

Industrial Applicability

In the present invention, dehydrogenation, defluorination, or substitution with various functional groups or metal atoms is selectively performed only for an exposed portion of a solid material to be treated (e.g., a fluoroplastic, a synthetic resin such as a plastic material having a C—H bond, glass, a metal, an animal or a plant, or a ceramic). Consequently, optical modification is performed to give that portion hydrophilicity, adhesion properties, ink absorptivity, corrosion resistance, and conductivity resulting from metal substitution. As an example, a fluoroplastic material can be bonded to a material of the same type or a different type with an extremely high adhesive strength with no damage to the original characteristics of the fluoroplastic material. This makes it possible to provide a fluoroplastic material composite structure with a high chemical resistance or the like by bonding a fluoroplastic sheet to the surface of, e.g., an epoxy resin, bakelite, an ABS resin, concrete, or a metal. In addition, by modifying a porous fluoroplastic material to have hydrophilicity, it is possible to use the material as a filtration device, such as a cartridge filter, a plate-type module supported by a plate and a frame in a plane film state, or a hollow fiber film module, a separator of a cell, or a heat-resistant adhesive tape.

As has been discussed above, the present invention can be applied to a wide variety of uses, such as the wall surfaces of vessels in chemical plants required to have a high mechanical strength, chemical laser vessels, high-voltage instruments, and printed circuit boards, in the chemical, machine, electronic parts, and gas/power industries.

What is claimed is:

1. A method for modifying a solid surface comprising:
   providing a solid material comprising a plastic material having a C—H bond;
   providing a window member transparent to ultraviolet radiation with a photon energy of not less than 80.6 kcal/mol;
   providing a liquid composition selected from the group consisting of (a) a compound in liquid form and (b) a solution in a solvent of a compound, wherein each compound contains a first atom with a bonding energy to a hydrogen atom of not less than 80.6 kcal/mol and a second atom or functional group, which is bonded to said first atom, whose bonding energy to said first atom is smaller than the photon energy of said ultraviolet radiation,
   forming a layer of said liquid composition between said window member and said solid material, said window member being positioned closely enough to said solid material such that capillary action is exerted between the window member and the solid material to form said layer of the liquid composition; and
   irradiating said ultraviolet radiation through said window member on an interface between the surface of said solid material and said liquid composition, thereby liberating hydrogen from said plastic material via said first atom and introducing said second atom or functional group in place of said liberated hydrogen.

2. A method according to claim 1, wherein said compound is selected from the group consisting of boron compound, a phosphorus compound, a sulfur compound, a platinum compound, a bromine compound, an oxygen compound, a chlorine compound, and a fluorine compound.

3. A method according to claim 2, wherein said compound is one member selected from the group consisting of $(BHNH)_3$, $B(CH_3)_3$, $B(C_2H_5)_3$, $B(C_6H_5)_3$, $B(OH)_2(C_6H_5)$, $P(CN)_3$, $P_2Se_5$, $P(CH_3)_3$, $P(C_2H_5)_3$, $P(C_3H_7)_3$, $P(C_4H_9)_3$, $P(C_6H_5)_3$, $P(CH_3)_2(C_6H_5)$, $P(CH_3)(C_6H_5)_2$, $P(C_6H_{17})_3$, $P(C_6H_{13})_3$, $P(C_8H_{17})_3$, $P(CH_3C_6H_4)_3$, $(SCN)_2$, $SO_2(NH_2)_2$, $Pt(CN)_2$, $Pt(SO_4)_2$, $BrCN$, $Br_2O$, $Br_2CF_2$, $BrCF_3$, $NO$, $NO_2$, $H_2O_2$, $O_3$, $Cl_2O$, $ClCN$, $AgCl$, $AlCl_3$, $AsCl_3$, $AuCl$, $AuCl_3$, $BaCl_2$, $BeCl_2$, $BiCl_3$, $CaCl_2$, $CdCl_2$, $CeCl_3$, $CoCl_2$, $CrCl_2$, $CsCl$, $CuCl$, $CuCl_2$, $ErCl_3$, $EuCl_2$, $EuCl_3$, $FeCl_n$, $GaCl_3$, $GdCl_3$, $GeCl_4$, $H_3BO_3$, $Na_2[Pt(OH)_6]$, $K_2[Pr(OH)_6]$, $O_2$, $CClF_3$, $CCl_2F_2$, pure water, heavy water, $(COOH)_2$, $CF_4$, $CHF_3$, $HgCl_2$, $HOCl_3$, $InCl$, $IrCl_4$, $KCl$, $LiCl$, $LuCl_3$, $MgCl_2$, $MnCl_2$, $MoCl_n$, $NCl_3$, $NH_4Cl$, $NaCl$, $NbCl_5$, $NiCl_2$, $PCl_3$, $PbCl_2$, $PtCl_n$, $RbCl$, $ReCl_3$, $SCln$, $SbCl_3$, $SeCl_n$, $SiCl_4$, $SnCl_n$, $SrCl_2$, $TaCl_2$, $TbCl_3$, $TeCl_n$, $ThCl_4$, $TiCl_3$, $TlCl_3$, $TmCl_3$, $UCl_n$, $VCl_n$, $WCl_6$, $YCl_3$, $ZnCl_2$, $ZrCl_4$, $H_2O$, $NH_3$, $HCOOH$, $NH_3OH$, $H_2SO_4$, $HCl$, $HNO_3$, alcohols, hydrocarbons, aromatics, $AgF$, $AsF_3$, $BaF_2$, $BeF_2$, $BiF_3$, $CdF_2$, $CeF_3$, $CoF_2$, $CsF$, $CuF$, $GeF_2$, $KF$, $MoF_n$, $NH_4F$, $NaF$, $NbF_5$, $NiF$, $UF_6$, $VF_n$, and $ZnF_2$.

4. A method according to claim 1, wherein said first atom is selected from the group consisting of B, P, S, Pt, Br, O, Cl, H, F, and a metal atom and said functional group is one member selected from the group consisting of —OH, —NO$_2$, —CN, —NH$_2$, —COOH, —CO, —OCH$_3$, —OC$_2$H$_5$, —OC$_3$H$_7$, —OC$_4$H$_9$, —CONH, —CH$_3$, —C$_2$H$_5$, —CH$_2$, —SO$_3$H, —C$_3$H$_7$, —C$_4$H$_9$, and —C$_6$H$_5$.

5. A method according to claim 1, wherein said solvent is selected from the group consisting of water, heavy water, ammonia, sulfuric acid, carbon tetrachloride, carbon disulfide, hydrocarbons, halogen compounds, amines, and sulfur compounds.

6. A method according to claim 1, wherein said ultraviolet radiation is irradiated from one or a combination selected from the group consisting of excimer lasers, XeF, XeCl, KrF, and ArF lasers, an N$_2$ laser, a Kr Iron laser, an Ar iron laser, and laser light amplified by a nonlinear element.

7. A method according to claim 1, wherein said ultraviolet radiation is irradiated from one or a combination selected from the group consisting of an Hf lamp, an He—Xe lamp, a D$_2$ lamp, and an excimer lamp.

8. A method according to claim 1, wherein said ultraviolet radiation is one or a combination of ultraviolet radiations obtained by an arc, corona, or silent discharge in a gas atmosphere.

* * * * *